US012757576B2

(12) United States Patent
Kim et al.

(10) Patent No.: US 12,757,576 B2
(45) Date of Patent: Oct. 6, 2026

(54) DISPLAY DEVICE AND METHOD FOR MANUFACTURING THE SAME

(71) Applicant: Samsung Display Co., Ltd., Yongin-si (KR)

(72) Inventors: Jong-Hoon Kim, Seoul (KR); Jiseong Yang, Suwon-si (KR); Jang-Il Kim, Anyang-si (KR); Jeongki Kim, Hwaseong-si (KR); Seok-Joon Hong, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 780 days.

(21) Appl. No.: 17/852,116

(22) Filed: Jun. 28, 2022

(65) Prior Publication Data

US 2023/0074534 A1 Mar. 9, 2023

(30) Foreign Application Priority Data

Sep. 3, 2021 (KR) ........................ 10-2021-0117564

(51) Int. Cl.

| | |
|---|---|
| ***H01L 27/32*** | (2006.01) |
| ***H10K 59/122*** | (2023.01) |
| ***H10K 71/00*** | (2023.01) |
| *H10K 59/12* | (2023.01) |
| *H10K 59/38* | (2023.01) |

(52) U.S. Cl.

CPC ........... *H10K 59/122* (2023.02); *H10K 71/00* (2023.02); *H10K 59/1201* (2023.02); *H10K 59/38* (2023.02)

(58) Field of Classification Search

CPC .. H10K 59/122; H10K 59/1201; H10K 59/38; H10K 71/00

USPC .......................................................... 257/342

See application file for complete search history.

(56) References Cited

U.S. PATENT DOCUMENTS

| | | | | |
|---|---|---|---|---|
| 7,414,361 | B2 | 8/2008 | Nozawa | |
| 8,436,348 | B2 | 5/2013 | Ono et al. | |
| 9,881,899 | B2 | 1/2018 | Nendai | |
| 11,778,885 | B2 | 10/2023 | Kim et al. | |
| 2014/0329056 | A1* | 11/2014 | Hou | H10K 59/122 427/271 |
| 2016/0247862 | A1* | 8/2016 | Song | H10K 71/135 |
| 2017/0125740 | A1* | 5/2017 | Lee | H10K 59/8792 |
| 2018/0045866 | A1* | 2/2018 | Chae | G02F 1/133553 |
| 2018/0331326 | A1* | 11/2018 | Woo | H10K 50/865 |

(Continued)

FOREIGN PATENT DOCUMENTS

| | | | |
|---|---|---|---|
| JP | 2018-189920 | A | 11/2018 |
| KR | 2006-0041975 | A | 5/2006 |

(Continued)

*Primary Examiner* — Dzung Tran

(74) *Attorney, Agent, or Firm* — Womble Bond Dickinson (US) LLP

(57) ABSTRACT

A display device includes: a display layer in which a plurality of light emitting regions are defined; a barrier rib disposed on the display layer and having a plurality of first openings overlapping the plurality of light emitting regions defined therein; and a plurality of optical patterns disposed in the plurality of first openings. The barrier rib may include a first portion around the plurality of first openings and a second portion spaced apart from the plurality of first openings with the first portion therebetween, and the first portion may be more liquid repellent than the second portion.

13 Claims, 17 Drawing Sheets

(56) References Cited

U.S. PATENT DOCUMENTS

| | | | | |
|---|---|---|---|---|
| 2019/0165085 | A1* | 5/2019 | Choi | H10K 50/856 |
| 2020/0152704 | A1* | 5/2020 | Jang | H10K 59/126 |
| 2020/0388663 | A1* | 12/2020 | Lee | H10K 59/126 |

FOREIGN PATENT DOCUMENTS

| | | | |
|---|---|---|---|
| KR | 2020-0054423 | A | 5/2020 |
| KR | 2021-0086791 | A | 7/2021 |
| WO | WO 2011/132215 | A1 | 10/2011 |
| WO | WO 2016/006230 | A1 | 1/2016 |
| WO | WO 2019/182041 | A1 | 9/2019 |

* cited by examiner

DISPLAY DEVICE AND METHOD FOR MANUFACTURING THE SAME

CROSS-REFERENCE TO RELATED APPLICATION

This application claims priority to and the benefit of Korean Patent Application No. 10-2021-0117564, filed on Sep. 3, 2021, the entire content of which is hereby incorporated by reference.

BACKGROUND

1. Field

The present disclosure herein relates to a display device having improved reliability by preventing or reducing defects caused by an ink deposition process, and a method for manufacturing the same.

2. Description of the Related Art

Display panels include a transmissive display panel that selectively transmits source light generated from a light source and a light emitting display panel that generates source light in the display panel itself. The display panels may include different types (kinds) of light control patterns according to pixels to generate color images. The light control patterns may transmit only a partial wavelength range of the source light and/or convert the color of the source light. Some light control patterns may change the properties of light without converting the color of the source light.

SUMMARY

Aspects according to one or more embodiments of the present disclosure are directed toward a display device having improved reliability by preventing or reducing defects caused by an ink deposition process (e.g., ink mislanding), and a method for manufacturing the same.

Additional aspects will be set forth in part in the description which follows and, in part, will be apparent from the description, or may be learned by practice of the presented embodiments of the disclosure.

According to one or more embodiments of the present disclosure, a display device includes: a display layer in which a plurality of light emitting regions are defined; a barrier rib on the display layer and having a plurality of first openings overlapping the plurality of light emitting regions defined therein; and a plurality of optical patterns in the plurality of first openings. The barrier rib may include a first portion around (e.g., surrounding) the plurality of first openings and a second portion spaced apart from the plurality of first openings with the first portion therebetween, and the first portion may be more liquid repellent than the second portion.

In an embodiment, the display device may further include a plurality of color filters overlapping the plurality of light emitting regions, the plurality of color filters may include a first color filter, a second color filter, and a third color filter, and each of the plurality of first openings may correspond to a corresponding one of the first color filter, the second color filter, or the third color filter.

In an embodiment, the barrier rib may further have a plurality of second openings non-overlapping (not overlapping) the plurality of light emitting regions further defined therein, the plurality of second openings may be surrounded by the second portion, and each of the plurality of second openings may overlap all of the first color filter, the second color filter, and the third color filter.

In an embodiment, when viewed on a plane, the second portion and the plurality of first openings may be spaced apart from by a first distance in a first direction or a second direction crossing the first direction.

In an embodiment, the first distance may be about 11 μm to about 20 μm.

In an embodiment, the display layer may include a first base substrate, a plurality of light emitting elements on the first base substrate, and an encapsulation layer covering the plurality of light emitting elements, and the first portion and the second portion of the barrier rib may be defined on a lower surface of the barrier rib, which faces the encapsulation layer.

In an embodiment, the display device may further include a second base substrate spaced apart from the display layer with the barrier rib and the plurality of optical patterns therebetween, and a plurality of color filters on a lower surface of the second base substrate, wherein the barrier rib and the plurality of optical patterns may be between the plurality of color filters and the display layer.

In an embodiment, the lower surface of the second base substrate in contact with the plurality of color filters may be flat.

In an embodiment, the second portion of the barrier rib may further include a spacer protruding towards the display layer.

In an embodiment, the display layer may include a base substrate, a plurality of light emitting elements on the base substrate, and an encapsulation layer covering the plurality of light emitting elements, and the first portion and the second portion of the barrier rib may be defined on an upper surface of the barrier rib, which faces oppositely away from the encapsulation layer.

In an embodiment, the display device may further include a plurality of color filters on the barrier rib and the plurality of optical patterns, and a cover layer covering the plurality of color filters.

In an embodiment, a lower surface of the cover layer in contact with the plurality of color filters may be curved to correspond to shapes of the plurality of color filters.

According to one or more embodiments of the present disclosure, a display device includes: a display layer in which a plurality of light emitting regions are defined; a barrier rib on the display layer and having a plurality of first openings overlapping the plurality of light emitting regions defined therein; and a plurality of optical patterns in the plurality of first openings, wherein the barrier rib includes a first portion around (e.g., surrounding) the plurality of first openings and a second portion spaced apart from the plurality of first openings with the first portion therebetween, and the first portion has a lower surface energy than the second portion.

According to one or more embodiments of the present disclosure, a method for manufacturing a display device includes: forming a barrier rib in which a plurality of first openings are defined; and forming a plurality of optical patterns in the plurality of first openings, wherein the forming of the barrier rib includes: forming a barrier rib layer; arranging a mask in which a first mask region that blocks light, a second mask region that transmits light, and a third mask region that blocks at least a portion of light are defined on the barrier rib layer; and patterning the barrier rib layer to form the plurality of first openings, wherein the barrier rib includes a first portion overlapping the second mask region and a second portion overlapping the third mask region, and the first portion is more liquid repellent than the second portion.

In an embodiment, the forming of the plurality of first openings may further include exposing the barrier rib layer to light, and the first portion may have a greater light exposure amount than the second portion.

In an embodiment, the method may further include forming a display layer, wherein the barrier rib layer is formed on the display layer.

In an embodiment, the method may further include forming a display layer, and combining the display layer, the barrier rib, and the plurality of optical patterns.

In an embodiment, the method may further include forming a plurality of color filters on a base substrate, wherein the barrier rib layer may be formed on the plurality of color filters.

In an embodiment, the forming of the barrier rib may further include forming a plurality of second openings spaced apart from the plurality of first openings.

In an embodiment, the plurality of second openings may be formed in a region in which three color filters transmitting three different colors among the plurality of color filters overlap.

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1A:
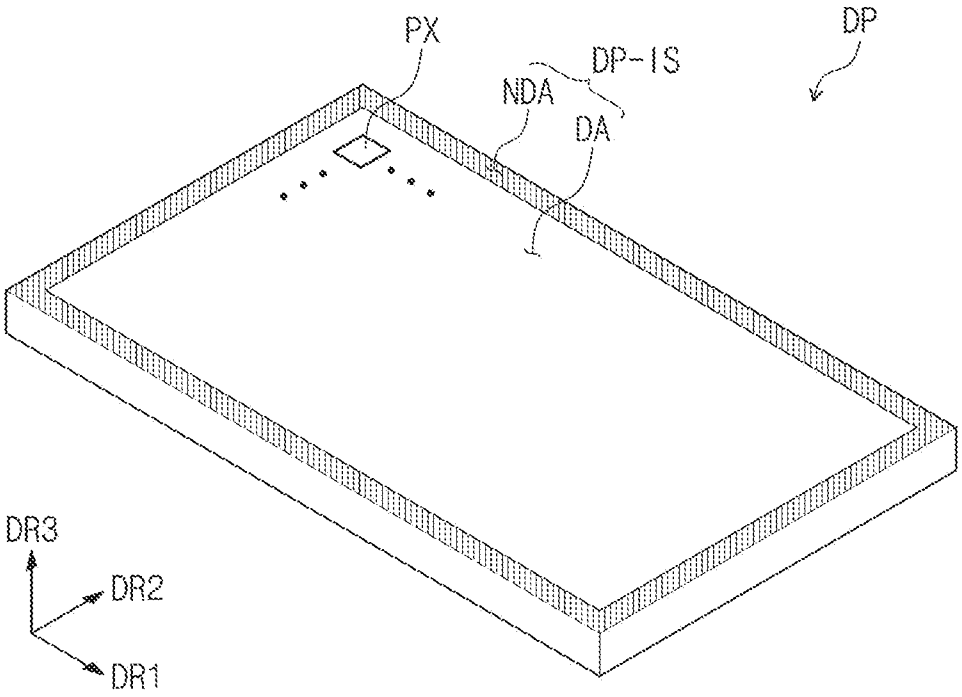
FIG. 1A is a perspective view of a display panel according to an embodiment of the present disclosure.

In the present description, when an element (or a region, a layer, a portion, etc.) is referred to as being "on," "connected to," or "coupled to" another element, it refers to that the element may be directly disposed on/connected to/coupled to the other element, or that a third element may be disposed therebetween.

Like reference numerals refer to like elements. In some embodiments, in the drawings, the thickness, the ratio, and the dimensions of elements may be exaggerated for an effective description of technical contents. The term "and/or," includes any and all combinations of one or more of the associated listed items. As used herein, expressions such as "at least one of", "one of", and "selected from", when preceding a list of elements, modify the entire list of elements and do not modify the individual elements of the list. For example, "at least one of a, b or c", may indicate only a, only b, only c, both (e.g., simultaneously) a and b, both (e.g., simultaneously) a and c, both (e.g., simultaneously) b and c, all of a, b, and c, or variations thereof. As used herein, the terms "substantially," "about," and similar terms are used as terms of approximation and not as terms of degree, and are intended to account for the inherent deviations in measured or calculated values that would be recognized by those of ordinary skill in the art. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It will be understood that, although the terms "first", "second", etc. may be used herein to describe one or more suitable elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In some embodiments, terms such as "below," "lower," "above," "upper," and/or the like are used to describe the relationship of the configurations shown in the drawings. The terms are used as a relative concept and are described with reference to the direction indicated in the drawings.

It should be understood that the terms "comprise," "include", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having a meaning that is consistent with their meaning in the context of the relevant art and will not be interpreted in an idealized or overly formal sense unless expressly so defined herein.

Hereinafter, embodiments of the present disclosure will be described with reference to the accompanying drawings.

Figure 1B:
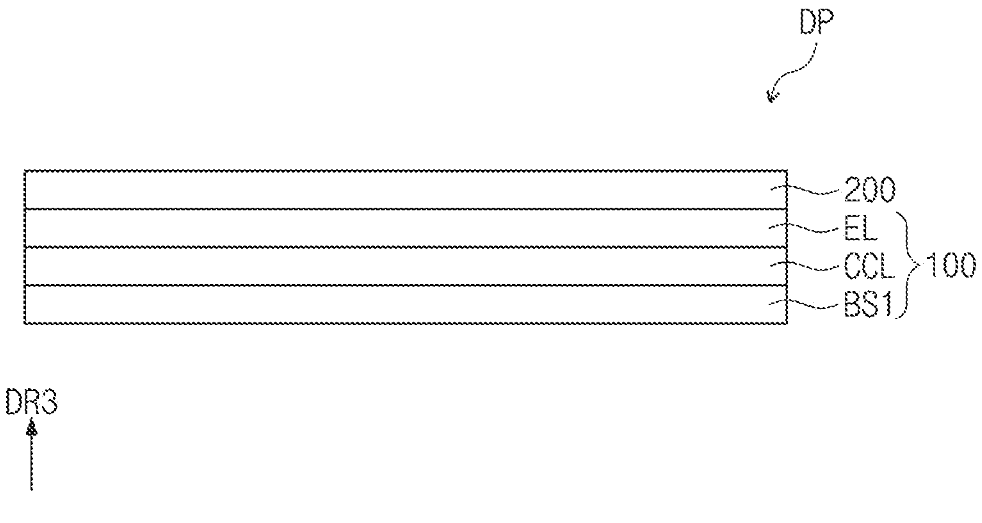
FIG. 1B is a schematic cross-sectional view of some components of a display panel according to an embodiment of the present disclosure.

FIG. 1A is a perspective view of a display panel DP according to an embodiment of the present disclosure. FIG. 1B is a schematic cross-sectional view of some components of a display panel DP according to an embodiment of the present disclosure.

As illustrated in FIG. 1A, the display device DP may display images through a display surface DP-IS. The display surface DP-IS is parallel to a plane defined by a first direction DR1 and a second direction DR2. The display surface DP-IS may include a display region DA and a non-display region NDA. A pixel PX is disposed in a display region DA, and the pixel PX is not disposed in a non-display region NDA. The non-display region NDA is defined along an edge of the display surface DP-IS. The non-display region NDA may surround the display region DA. In an embodiment of the present disclosure, the non-display region NDA may not be provided or may be disposed only on one side of the display region DA.

A normal direction of the display surface DP-IS, that is, a thickness direction of the display panel DP, is indicated by a third direction DR3. A front surface (or an upper surface) and a rear surface (or a lower surface) of respective layers or units which will be described are separated by (e.g., along) the third direction DR3. However, the first to third directions DR1, DR2, and DR3 illustrated in the present embodiment are merely examples.

In an embodiment of the present disclosure, the display panel DP having a planar front surface DP-IS is illustrated, but the present disclosure is not limited thereto. The display panel DP may further include a curved display surface or a three-dimensional display surface. The three-dimensional display surface may include a plurality of display regions indicating (e.g., oriented toward) different directions.

As illustrated in FIG. 1B, the display panel DP may include a first display substrate 100 and a second display substrate 200. The first display substrate 100 may include a base layer BS1, a circuit layer CCL, and a display element layer EL.

The base layer BS1 may include a synthetic resin substrate or a glass substrate. The circuit layer CCL may include at least one insulating layer and a circuit element. The circuit element may include signal lines, pixel driving circuits, and/or the like. The circuit layer CCL may be formed through a process of forming an insulating layer, a semiconductor layer, and/or a conductive layer utilizing coating, deposition, and/or the like and a process of pattering the insulating layer, the semiconductor layer, and/or the conductive layer utilizing a photolithography process. The display element layer EL may include at least one display element.

The second display substrate 200 may convert the color of light provided from a display device. The second display substrate 200 may include a light control pattern and a structure for increasing light conversion efficiency.

Figure 2:
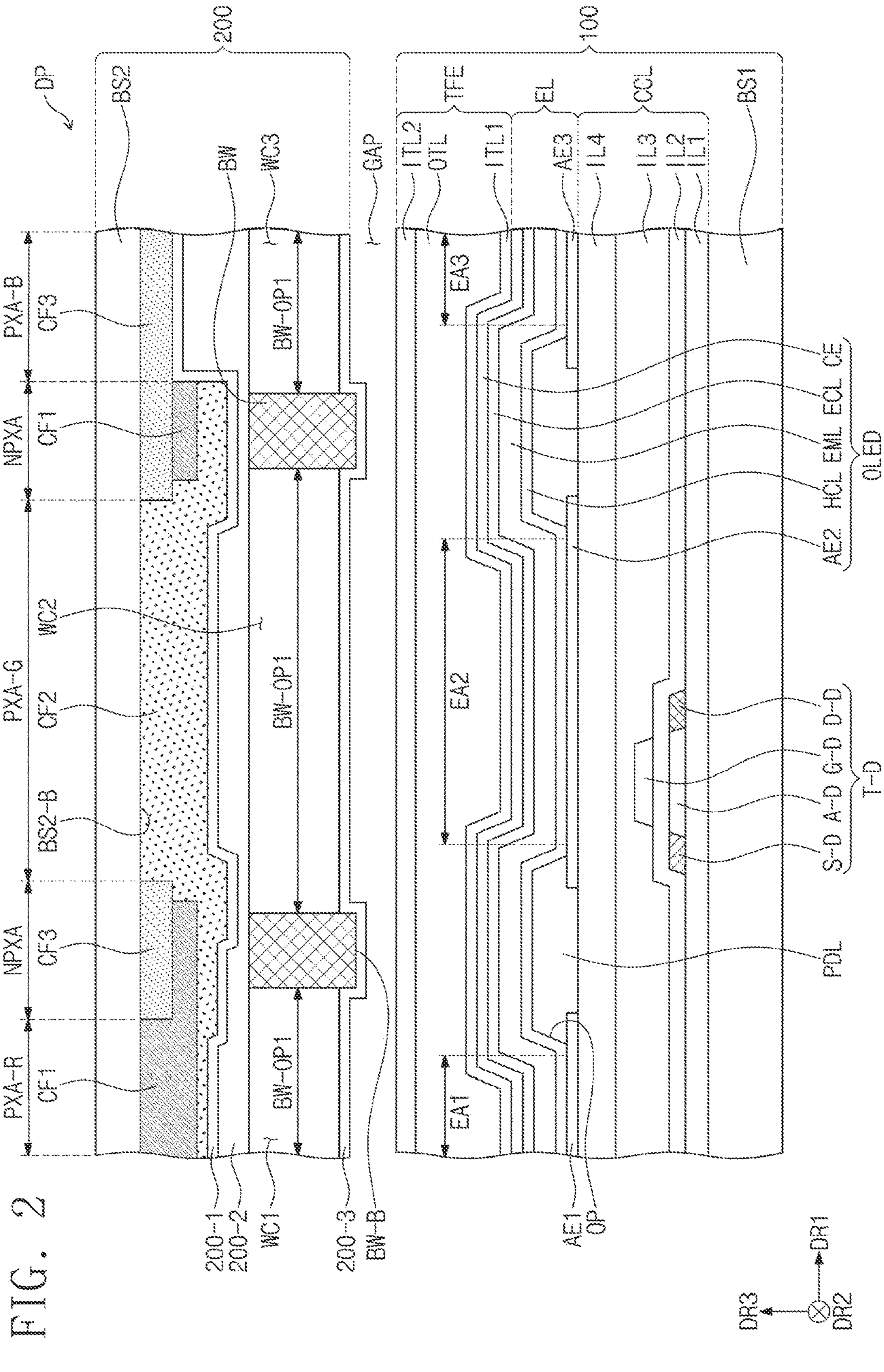
FIG. 2 is a cross-sectional view of a display panel according to an embodiment of the present disclosure.

FIG. 2 is a cross-sectional view of a display panel DP according to an embodiment of the present disclosure.

Referring to FIG. 2, the display panel DP may include a first display substrate 100 (or a lower display substrate) and a second display substrate 200 (or an upper display substrate) facing and spaced apart from the first display substrate 100. A set or set or predetermined cell gap GAP may be formed between the first display substrate 100 and the second display substrate 200. The cell gap GAP may be maintained by a sealant bonding the first display substrate 100 with the second display substrate 200. The sealant may be disposed in the non-display region NDA illustrated in FIG. 1A. In an embodiment of the present disclosure, a synthetic resin material may be disposed in the cell gap GAP. In FIG. 2, a case in which the display panel DP is an organic light emitting display panel will be described as an example.

A first pixel region PXA-R, a second pixel region PXA-G, a third pixel region PXA-B, and a peripheral region NPXA may be defined in the display panel DP.

The display panel DP may provide a first color light through the first pixel region PXA-R, a second color light through the second pixel region PXA-G, and a third color light through the third pixel region PXA-B. The first color light, the second color light, and the third color light may be light of different colors. In some embodiments, one of the first to third color lights may be green light, another may be red light, and the other may be blue light.

The peripheral region NPXA may be a region disposed adjacent to the first pixel region PXA-R, the second pixel region PXA-G, and the third pixel region PXA-B. The peripheral region NPXA may set a boundary of the first pixel region PXA-R, the second pixel region PXA-G, and the third pixel region PXA-B. The peripheral region NPXA may prevent or substantially prevent the first pixel region PXA-R, the second pixel region PXA-G, and the third pixel region PXA-B from being color mixed. In some embodiments, the peripheral region NPXA may block or reduce the source light to prevent or reduce or substantially prevent or reduce the source light from being provided to users.

The first display substrate 100 may include a first base layer BS1 (or a base layer), a circuit layer CCL, a display element layer EL, and a thin film encapsulation layer TFE. The circuit layer CCL may be disposed on the first base layer BS1. The circuit layer CCL may include a plurality of insulating layers, a plurality of conductive layers, and a semiconductor layer. The display element layer EL may be disposed on the circuit layer CCL. The thin film encapsulation layer TFE may be disposed on the display element layer EL and may encapsulate the display element layer EL.

The first base layer BS1 may be a stack structure including a silicon substrate, a plastic substrate, a glass substrate, an insulating film, or a plurality of insulating layers.

The circuit layer CCL may include a plurality of transistors and a plurality of insulating layers IL1, IL2, IL3, and IL4. In FIG. 2, one driving transistor T-D is illustrated as an example. The plurality of insulating layers IL1, IL2, IL3, and IL4 may include a first insulating layer IL1, a second insulating layer IL2, a third insulating layer IL3, and a fourth insulating layer IL4.

The first insulating layer IL1 may be disposed on the first base layer BS1, and the driving transistor T-D may be disposed on the first insulating layer IL1. The driving transistor T-D may include an active (e.g., an active layer) A-D, a source (e.g., a source electrode) S-D, a drain (e.g., a drain electrode) D-D, and a gate (e.g., a gate electrode) G-D.

The Active A-D, the source S-D, and the drain D-D may be regions divided according to the doping concentration or conductivity of a semiconductor pattern. The active A-D, the source S-D, and the drain D-D may be disposed above the first insulating layer IL1. The active A-D, the source S-D, and the drain D-D may have higher adhesion to the first insulating layer IL1 than the first base layer BS1.

The first insulating layer IL1 may be a barrier layer protecting lower surfaces of the active A-D, the source S-D, and the drain D-D. In this case, the first insulating layer IL1 may block or reduce the first base layer BS1 itself (e.g., components of the first base layer BS1), contaminants, and/or moisture introduced through the first base layer BS1 from penetrating into the active A-D, the source S-D, and the drain D-D. In some embodiments, the first insulating layer IL1 may be a light blocking layer that blocks or reduces external light incident through the first base layer BS1 from being incident to the active A-D. In this case, the first insulating layer IL1 may further include a light blocking material.

The second insulating layer IL2 may be disposed on the first insulating layer IL1 and may cover the active A-D, the source S-D, and the drain D-D. The second insulating layer IL2 may include an inorganic material. The inorganic material may include at least one of silicon nitride, silicon oxy nitride, silicon oxide, titanium oxide, or aluminum oxide.

The gate G-D may be disposed on the second insulating layer IL2. The third insulating layer IL3 may be disposed on the second insulating layer IL2 and may cover the gates G-D. The third insulating layer IL3 may be formed of a single layer or a plurality of layers. In some embodiments, the single layer may include an inorganic layer. The plurality of layers may include an organic layer and an inorganic layer.

The fourth insulating layer IL4 may be disposed on the third insulating layer IL3. The fourth insulating layer IL4 may be formed of a single layer or a plurality of layers. In some embodiments, the single layer may include an organic layer. The plurality of layers may include an organic layer and an inorganic layer. The fourth insulating layer IL4 may be a planarization layer providing a flat surface on an upper portion thereof.

The display element layer EL may be disposed on the fourth insulating layer IL4. The display element layer EL may include a light emitting element OLED and a pixel defining film PDL. In the present embodiment, the light emitting element OLED may be an organic light emitting diode, but the present disclosure is not limited thereto. In some embodiments, the light emitting element OLED may be a micro LED element or a nano LED element. The pixel defining film PDL may be an organic layer.

The light emitting element OLED may include a first electrode AE2 (hereinafter, a second pixel electrode), a hole control layer HCL, an emission layer EML, an electron control layer ECL, and a second electrode CE (or a common electrode). The second pixel electrode AE2 may be provided separately for each pixel. FIG. 2 illustrates, as an example, a first pixel electrode AE1, a second pixel electrode AE2, and a third pixel electrode AE3.

The first pixel electrode AE1 may be disposed to correspond to the first pixel region PXA-R, the second pixel electrode AE2 may be disposed to correspond to the second pixel region PXA-G, and the third pixel electrode AE3 may be disposed to correspond to the third pixel region PXA-B. As described herein, the term "correspond" indicates that two components overlap each other when viewed in the thickness direction DR3 of the display panel DP, and is not limited to the same area.

The first pixel electrode AE1, the second pixel electrode AE2, and the third pixel electrode AE3 may be disposed on the fourth insulating layer IL4. The first pixel electrode AE1, the second pixel electrode AE2, and the third pixel electrode AE3 may each be directly or indirectly electrically connected to a corresponding driving transistor. For example, the second pixel electrode AE2 may be directly or indirectly connected to the driving transistor T-D illustrated in FIG. 2. In FIG. 2, a connection structure between the second pixel electrode AE2 and the driving transistor T-D is not illustrated.

The pixel defining film PDL may expose a portion of each of the first pixel electrode AE1, the second pixel electrode AE2, and the third pixel electrode AE3. In some embodiments, light emitting openings OP may be defined in the pixel defining film PDL. A portion of each of the first pixel electrode AE1, the second pixel electrode AE2, and the third pixel electrode AE3 may be exposed through the light emitting openings OP.

A first light emitting region EA1, a second light emitting region EA2, and a third light emitting region EA3 may each be defined through the light emitting openings OP. In some embodiments, the first light emitting region EA1 may be defined to correspond to the first pixel region PXA-R, the second light emitting region EA2 may be defined to correspond to the second pixel region PXA-G, and the third light emitting region EA3 may be defined to correspond to the third pixel region PXA-B. As described herein, the term "correspond" indicates that two components overlap each other when viewed in the thickness direction DR3 of the display panel DP, and is not limited to the same area.

The hole control layer HCL, the emission layer EML, the electron control layer ECL, and the second electrode CE may be commonly disposed in the first pixel region PXA-R, the second pixel region PXA-G, the third pixel region PXA-B, and the peripheral region NPXA. The hole control layer HCL may include a hole transport layer, and may further include a hole injection layer.

The emission layer EML may have a single-layered structure or a tandem structure. The emission layer EML may generate blue light as a source light. The blue light may have a wavelength of about 410 nm (nanometer) to about 480 nm. The light emission spectrum of blue light may have a peak wavelength of about 440 nm to about 460 nm. The emission layer EML may be commonly or independently disposed in the first to third pixel regions PXA-R, PXA-G, and PXA-B. The independent arrangement refers to that the emission layer EML is separated for each of the first to third pixel regions PXA-R, PXA-G, and PXA-B.

The electron control layer ECL may include an electron transport layer and may further include an electron injection layer. The second electrode CE may be disposed on the electron control layer ECL. The second electrode CE may be commonly disposed in a plurality of pixels PX (see FIG. 1A).

The thin film encapsulation layer TFE may be disposed on the second electrode CE. In some embodiments, the thin film encapsulation layer TFE may be directly disposed on the display element layer EL. The thin film encapsulation layer TFE may include a first inorganic encapsulation layer ITL1, an organic encapsulation layer OTL, and a second inorganic encapsulation layer ITL2, which are sequentially stacked. The organic encapsulation layer OTL may be disposed between the first inorganic encapsulation layer ITL1 and the second inorganic encapsulation layer ITL2. The first inorganic encapsulation layer ITL1 and the second inorganic encapsulation layer ITL2 may be formed through deposition of an inorganic material, and the organic encapsulation layer OTL may be formed through deposition, printing, or coating of an organic material.

The first inorganic encapsulation layer ITL1 and the second inorganic encapsulation layer ITL2 may protect the display element layer EL against moisture/oxygen, and the organic encapsulation layer OTL may protect the display element layer EL against impurities such as dust particles.

The first inorganic encapsulation layer ITL1 and the second inorganic encapsulation layer ITL2 may include at least one of silicon nitride, silicon oxynitride, silicon oxide, titanium oxide, or aluminum oxide. The organic encapsulation layer OTL may include a polymer, for example, an acryl-based organic layer. However, this is presented as an example, and the embodiment of the present disclosure is not limited thereto.

FIG. 2 illustrates that the thin film encapsulation layer TFE includes two inorganic layers and one organic layer as an example, but the embodiment is not limited thereto. In some embodiments, the thin film encapsulation layer TFE may include three inorganic layers and two organic layers, and in this case, may have a structure in which the inorganic layers and the organic layers are alternately stacked. In some embodiments, the display panel DP may further include a refractive index control layer on an upper side of the thin film encapsulation layer TFE to increase light output efficiency.

The second display substrate 200 may be disposed on the first display substrate 100. The second display substrate 200 may include a second base layer BS2 (or a cover base layer), a first color filter CF1, a second color filter CF2, a third color filter CF3, a first optical pattern WC1, a second optical pattern WC2, a third optical pattern WC3, a barrier rib BW, and a plurality of insulating layers 200-1, 200-2, and 200-3.

The second base layer BS2 may be a stack structure including a silicon substrate, a plastic substrate, a glass substrate, an insulating film, or a plurality of insulating layers. A lower surface BS2-B of the second base layer BS2 may be flat.

The plurality of color filters CF1, CF2, and CF3 may be disposed on one surface of the second base layer BS2. In some embodiments, the plurality of color filters CF1, CF2, and CF3 may be disposed on a lower surface of the second base layer BS2. The first color filter CF1 may be disposed to overlap the first light emitting region EA1, the second color filter CF2 may be disposed to overlap the second light emitting region EA2, and the third color filter CF3 may be disposed to overlap the third light emitting region EA3.

The third color filter CF3 may be disposed in the third pixel region PXA-B and the peripheral region NPXA. A plurality of openings may be defined in the third color filter CF3. The plurality of openings may define the first pixel region PXA-R and the second pixel region PXA-G. The first color filter CF1 may be disposed to overlap the first pixel region PXA-R, and the second color filter CF2 may be disposed to overlap the second pixel region PXA-G.

The first to third color filters CF1, CF2, and CF3 may each transmit light in a specific wavelength range and block or reduce light outside the corresponding wavelength range. The first to third color filters CF1, CF2, and CF3 may each include a base resin and a dye and/or a pigment dispersed in the base resin. The base resin is a medium in which dyes and/or pigments are dispersed, and may be formed of one or more suitable resin compositions that may be generally referred to as binders.

The first color filter CF1 may transmit the first color light, the second color filter CF2 may be to transmit the second color light, and the third color filter CF3 may be to transmit the source light provided from the emission layer EML. In some embodiments, the first color filter CF1 may be a red color filter, the second color filter CF2 may be a green color filter, and the third color filter CF3 may be a blue color filter. In an embodiment of the present disclosure, the first color filter CF1 and the second color filter CF2 may be yellow color filters. In this case, the first color filter CF1 and the second color filter CF2 may be connected to each other and provided (e.g., as a single body).

The first color filter CF1 may be disposed adjacent to the second color filter CF2. The third color filter CF3 may overlap the first color filter CF1 and the second color filter CF2. A region in which the plurality of color filters CF1, CF2, and CF3 all overlap may block or reduce light. In this case, a black mattress including a light blocking material may not be included. A region in which the plurality of color filters CF1, CF2, and CF3 all overlap may correspond to the peripheral region NPXA and may correspond to the barrier rib BW. The term "correspond" indicates that two components overlap each other when viewed in the thickness direction DR3 of the display panel DP, and is not limited to the same area.

The first insulating layer 200-1 may be disposed below the first color filter CF1, the second color filter CF2, and the third color filter CF3, and may cover the first color filter CF1, the second color filter CF2, and the third color filter CF3. The second insulating layer 200-2 may cover the first insulating layer 200-1 and may provide a flat surface on a lower side. The first insulating layer 200-1 may be an inorganic film, and the second insulating layer 200-2 may be an organic film.

The barrier rib BW may be disposed below the second insulating layer 200-2. The barrier rib BW may be disposed in the peripheral region NPXA. A plurality of first openings BW-OP1 may be defined in the barrier rib BW. The barrier rib BW may include a material having a transmittance of a set or predetermined value or less. In some embodiments, the barrier rib BW may include a light blocking material, for example, a typical black component. The barrier rib BW may include a black dye and/or a black pigment mixed with a base resin. In some embodiments, the barrier rib BW may include at least one of propylene glycol methyl ether acetate, 3-methoxy-n-butyl acetate, an acrylate monomer, an acrylic monomer, an organic pigment, or acrylate ester.

The lower surface BW-B of the barrier rib BW may be defined on a surface facing the thin film encapsulation layer TFE. A first portion P1 (see FIG. 3A) and a second portion P2 (see FIG. 3A) may be defined on the lower surface BW-B of the barrier rib BW. This will be described in more detail later.

The plurality of first openings BW-OP1 may respectively correspond to the first pixel region PXA-R, the second pixel region PXA-G, and the third pixel region PXA-B. The plurality of first openings BW-OP1 may respectively correspond to the first light emitting region EA1, the second light emitting region EA2, and the third light emitting region EA3. The term "correspond" indicates that two components overlap each other when viewed in the thickness direction DR3 (e.g., in a plan view) of the display panel DP, and is not limited to the same area.

The first optical pattern WC1 may be disposed inside one of the plurality of first openings BW-OP1 and may convert the source light into the first color light. The second optical pattern WC2 may be disposed inside one of the plurality of first openings BW-OP1 and may convert the source light into the second color light. The third optical pattern WC3 may be disposed inside one of the plurality of first openings BW-OP1 and may be to transmit the source light.

The first optical pattern WC1, the second optical pattern WC2, and the third optical pattern WC3 may be formed through an inkjet process. Compositions (e.g., ink compositions) may be provided to a place defined by the barrier rib BW, for example, each of the plurality of first openings BW-OP1, to form the first optical pattern WC1, the second optical pattern WC2, and the third optical pattern WC3.

The first optical pattern WC1 and the second optical pattern WC2 may each include a base resin, quantum dots, and scattering particles, and the third optical pattern WC3 may include a base resin and scattering particles. In an embodiment of the present disclosure, scattering particles may not be provided in any one of the first optical pattern WC1, the second optical pattern WC2, or the third optical pattern WC3.

The base resin is a medium in which quantum dots or scattering particles are dispersed, and may be formed of one or more suitable resin compositions that may be generally referred to as binders. However, the embodiment of the present disclosure is not limited thereto, and in the present description, any medium capable of dispersing quantum dots may be referred to as a base resin regardless of its name, additional other functions, constituent materials, and/or the like. The base resin may be a polymer resin. In some embodiments, the base resin may be an acrylic resin, a urethane-based resin, a silicone-based resin, an epoxy-based resin, and/or the like. The base resin may be a transparent resin.

The scattering particles may be titanium oxide ($TiO_2$) or silica-based nanoparticles. The scattering particles may scatter incident light to increase an amount of light provided to the outside. In an embodiment of the present disclosure, at least one of the first optical pattern WC1 or the second optical pattern WC2 may not include (e.g., may exclude) scattering particles.

Quantum dots may be particles converting the wavelength of incident light. A quantum dot has a crystalline structure of a few nanometers in size, contains hundreds to thousands of atoms, and exhibits a quantum confinement effect in which an energy band gap is increased due to its small size. When light of a wavelength having higher energy than the band gap is incident on the quantum dot, the quantum dot absorbs the light to be excited, and falls to a ground state while emitting light of a specific wavelength. The emitted light of the specific wavelength has a value corresponding to the band gap. When the quantum dot is adjusted in size and composition, light emitting properties due to the quantum confinement effect may be controlled.

The core of each quantum dot may be selected from a Group II-VI compound, a Group III-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and/or $In_2Se_3$, a ternary compound such as $InGaS_3$ and/or $InGaSe_3$, or any combination thereof.

The Group I-III-VI compound may include a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, and any mixture thereof; and/or a quaternary compound such as $AgInGaS_2$ and/or $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In some embodiments, the Group III-V compound may further include a Group II metal. In some embodiments, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof. The Group IV element may be selected from the group consisting of Si, Ge, and a mixture thereof. The Group IV compound may be a binary compound selected from the group consisting of SiC, SiGe, and a mixture thereof.

The binary compound, the ternary compound, and/or the quaternary compound may be present in particles in a substantially uniform concentration distribution, or may be present in substantially the same particles in a partially different concentration distribution. In some embodiments, a core/shell structure in which one quantum dot surrounds another quantum dot may be present. An interface between the core and the shell may have a concentration gradient in which the concentration of an element present in the shell becomes lower towards the center.

In some embodiments, quantum dots may have the core/shell structure including a core having nano-crystals, and a shell around (e.g., surrounding)) the core, which are described above. The shell of the quantum dots may serve as a protection layer to prevent or reduce the chemical deformation of the core so as to keep semiconductor properties, and/or a charging layer to impart electrophoresis properties to the quantum dots. The shell may be a single layer or multiple layers. An interface between the core and the shell may have a concentration gradient in which the concentration of an element present in the shell becomes lower towards the center. Examples of the shell of the quantum dots may be a metal or non-metal oxide, a semiconductor compound, or a combination thereof.

In some embodiments, the metal or the non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, or a ternary compound such as $MgAl_2O_4$, $CoFe_2O_4$, $NiFe_2O_4$, and/or $CoMn_2O_4$, but the embodiment of the present disclosure is not limited thereto.

In some embodiments, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiment of the present disclosure is not limited thereto.

Quantum dots may have a full width of half maximum (FWHM) of a light emitting wavelength spectrum of about 45 nm or less, about 40 nm or less, or about 30 nm or less, and color purity and/or color reproducibility may be enhanced in the above ranges. In some embodiments, light emitted through such quantum dots is emitted in all directions, and thus a wide viewing angle may be improved.

In some embodiments, the form of quantum dots is not particularly limited as long as it is a form commonly utilized in the art, and for example, a quantum dot in the form of spherical, pyramidal, multi-arm, or cubic nanoparticles, nanotubes, nanowires, nanofibers, nanoplatelets, etc. may be utilized.

The quantum dots may control the color of emitted light according to particle size thereof, and thus the quantum dots may have one or more suitable colors of emitted light such as blue, red, green, etc.

The third insulating layer 200-3 may cover the barrier rib BW, the first optical pattern WC1, the second optical pattern WC2, and the third optical pattern WC3. In some embodiments, the third insulating layer 200-3 may be an inorganic layer sealing the barrier rib BW, the first optical pattern WC1, the second optical pattern WC2, and the third optical pattern WC3.

Figure 3A:
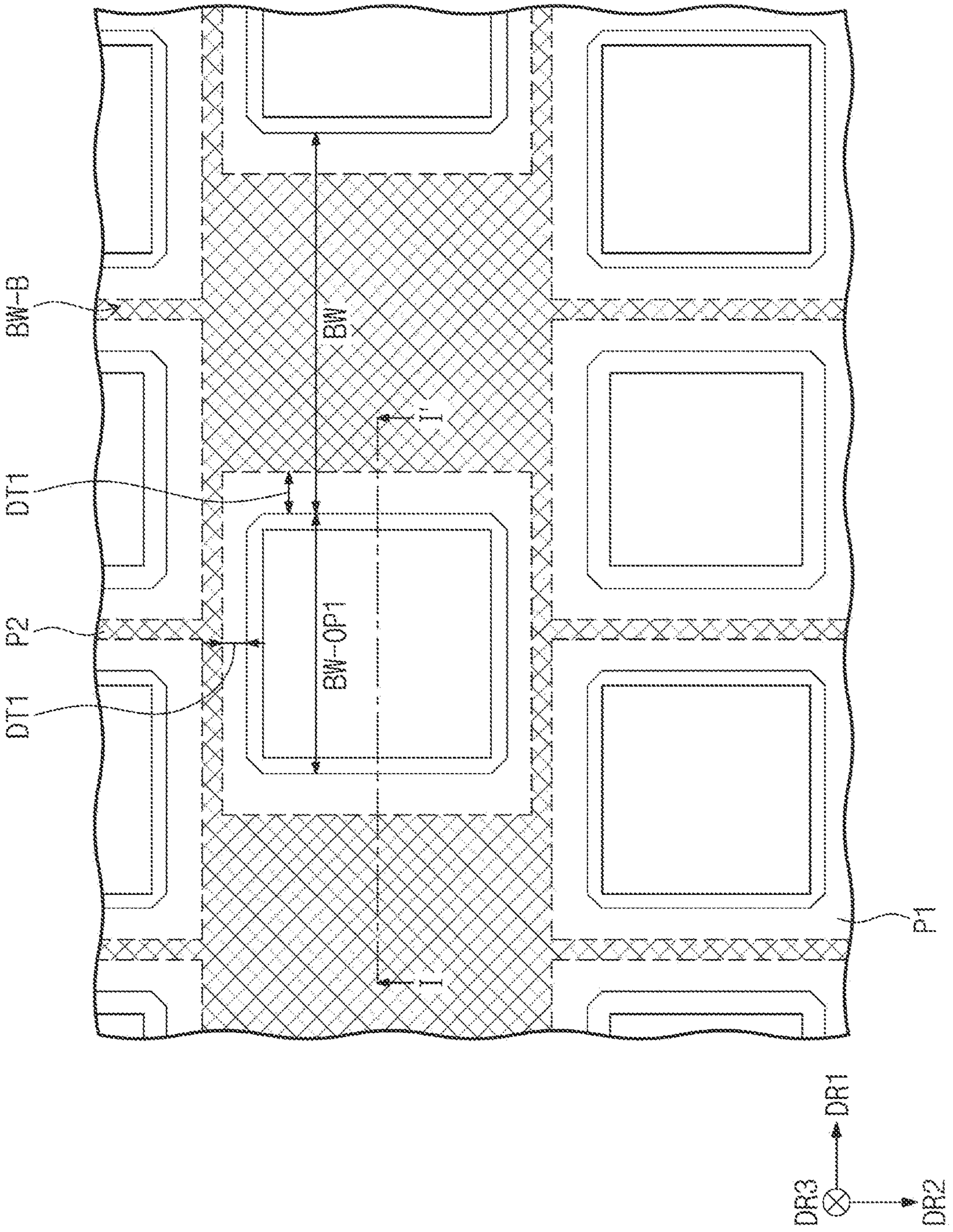
FIG. 3A is a plan view illustrating a portion of a display panel according to an embodiment of the present disclosure.
Figure 3B:
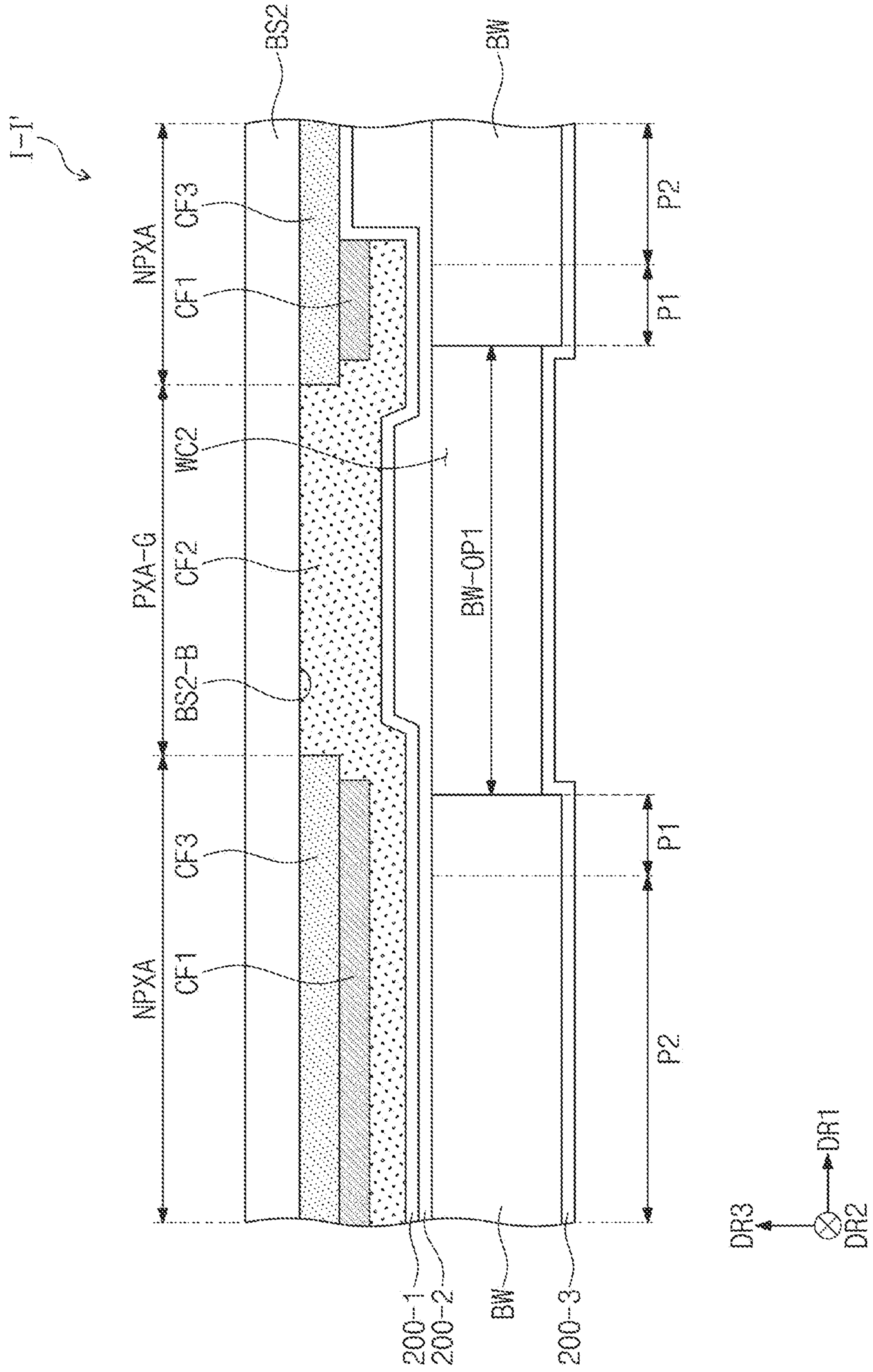
FIG. 3B is a cross-sectional view illustrating a portion of a display panel including a cross-section corresponding to the line I-I' of FIG. 3A.

FIG. 3A is a plan view illustrating a portion of a display panel DP according to an embodiment of the present disclosure. FIG. 3B is a cross-sectional view illustrating a portion of a display panel DP including a cross-section corresponding to the line I-I' of FIG. 3A.

FIG. 3A illustrates the lower surface BW-B of the barrier rib BW. The plurality of first openings BW-OP1 may be defined in the barrier rib BW. FIG. 3A is a plan view looking at the barrier rib BW along the third direction DR3 from the cell gap (see FIG. 2). The lower surface BW-B of the barrier rib BW may be defined as the surface facing the thin film encapsulation layer TFE (see FIG. 2).

Referring to FIGS. 2, 3A, and 3B, the plurality of first openings BW-OP1 may be defined by the barrier rib BW, and may overlap the plurality of light emitting regions EA1, EA2, and EA3. The plurality of first openings BW-OP1 may each overlap a corresponding one of the first color filter CF1, the second color filter CF2, or the third color filter CF3. A composition IK (or ink, ink composition, see FIG. 7C) is provided to each of the plurality of first openings BW-OP1 to form the first optical pattern WC1, the second optical pattern WC2, and the third optical pattern WC3. FIG. 3B illustrates the first opening BW-OP1 corresponding to the second color filter CF2 and having the second optical pattern WC2 formed therein as an example.

The barrier rib BW may include the first portion P1 and the second portion P2. The first portion P1 and the second portion P2 may be connected to each other as a single body. The first portion P1 and the second portion P2 may be defined on the lower surface BW-B of the barrier rib BW, which faces the thin film encapsulation layer TFE. The first portion P1 may be defined as the portion around (e.g., surrounding) the plurality of first openings BW-OP1. In some embodiments, the plurality of first openings BW-OP1 may each be entirely surrounded by the first portion P1. The second portion P2 may be defined as the portion spaced apart from the plurality of first openings BW-OP1 with the first portion P1 therebetween.

The first portion P1 may be more liquid repellent than the second portion P2. The feature of being more liquid repellent may be defined as being more lyophobic. The lyophobic property may be a property of low affinity between dispersoid and dispersion medium. Accordingly, when a material (e.g., liquid or ink) is dropped onto a portion which is more liquid repellent, it may form a spherical shape having a smaller radius of curvature than when the material is dropped onto a portion which is less liquid repellent.

The second portion P2 may be defined as the portion adjacent to the first portion P1 and around (e.g., surrounding) the first portion P1. The second portion P2 may be defined to be spaced apart from the plurality of first openings BW-OP1 by a first distance DT1 in the first direction DR1. In some embodiments, the second portion P2 may be defined to be spaced apart from the plurality of first openings BW-OP1 by a first distance DT1 in the second direction DR2 crossing the first direction DR1.

The second portion P2 may be less liquid repellent than the first portion P1. When ink IK is landed (e.g., deposited or mislanded) onto the barrier rib BW instead of the first opening BW-OP1 defined in the barrier rib BW, the ink IK may spread due to the second portion P2 which is relatively less liquid repellent. For example, the ink IK landed onto the second portion P2 may form a partial sphere shape having a large radius of curvature, and a height formed by the ink IK on the barrier rib BW may be reduced. Accordingly, in a subsequent bonding process, a gap defect in upper and lower plates or cracks of a thin film encapsulation layer may be less likely to happen or may be prevented or reduced.

The first portion P1 may be more liquid repellent than the second portion P2. The first portion P1 is adjacent to the first opening BW-OP1 and is relatively more liquid repellent, and thus, even when coating liquid supplied to the first opening BW-OP1 is landed onto an upper surface of the first portion P1 of the barrier rib BW, it may not move to another portion. Accordingly, defects in which the coating liquid flows out to another adjacent first opening BW-OP1 supplied with a different type or kind of coating liquid may be reduced.

Smaller first distance DT1 may result in greater area of the second portion P2. The greater second portion P2 may result in greater reliability of preventing or reducing defects in which ink is landed onto the barrier rib BW. However, when the first distance DT1 is less than 11 μm, the first portion P1 has a smaller area, and thus, the effectiveness of the first portion P1, which is more liquid repellent, may be reduced. In some embodiments, when the first distance DT1 is greater than 20 μm, the effectiveness of preventing or reducing ink landing (e.g., deposition) defects may be reduced. Accordingly, the first distance DT1 may be about 11 μm to about 20 μm.

The first portion P1 may have a lower surface energy than the second portion P2. The greater the exposure amount (e.g., light exposure amount during the photolithography process in forming the barrier rib BW), the greater the liquid repellent properties, and with the greater liquid repellent properties, the measured surface energy may be low. For example, the first portion P1 formed with greater light exposure than the second portion P2 may have a lower surface energy than the second portion P2, and a lower surface energy will impart greater liquid repellent properties. The first portion P1 and the second portion P2 are formed with different light exposure amounts, but the upper surface of the first portion P1 and the upper surface of the second portion P2 may be aligned with each other.

Figure 4A:
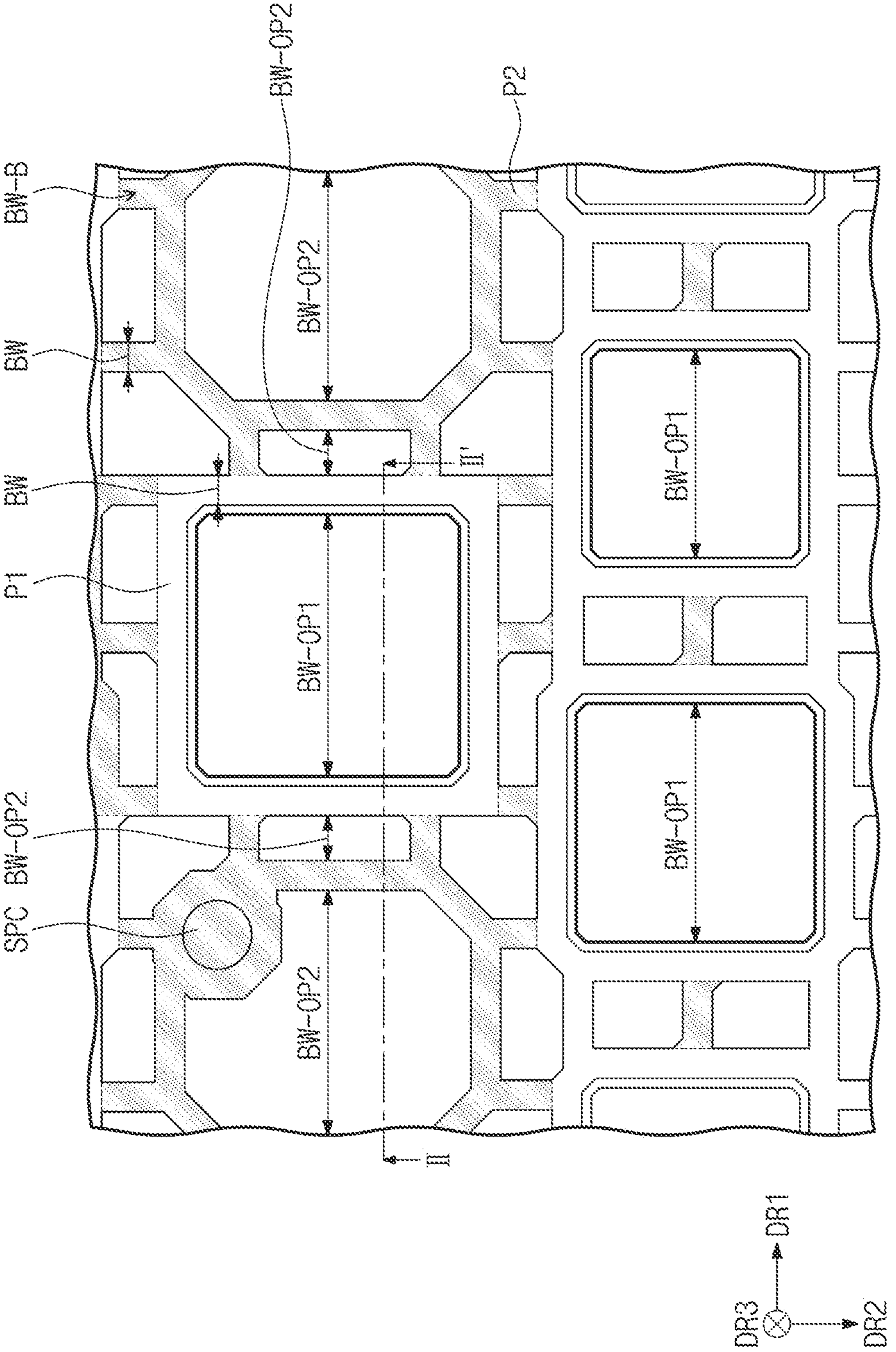
FIG. 4A is a plan view illustrating a portion of a display panel according to an embodiment of the present disclosure.
Figure 4B:
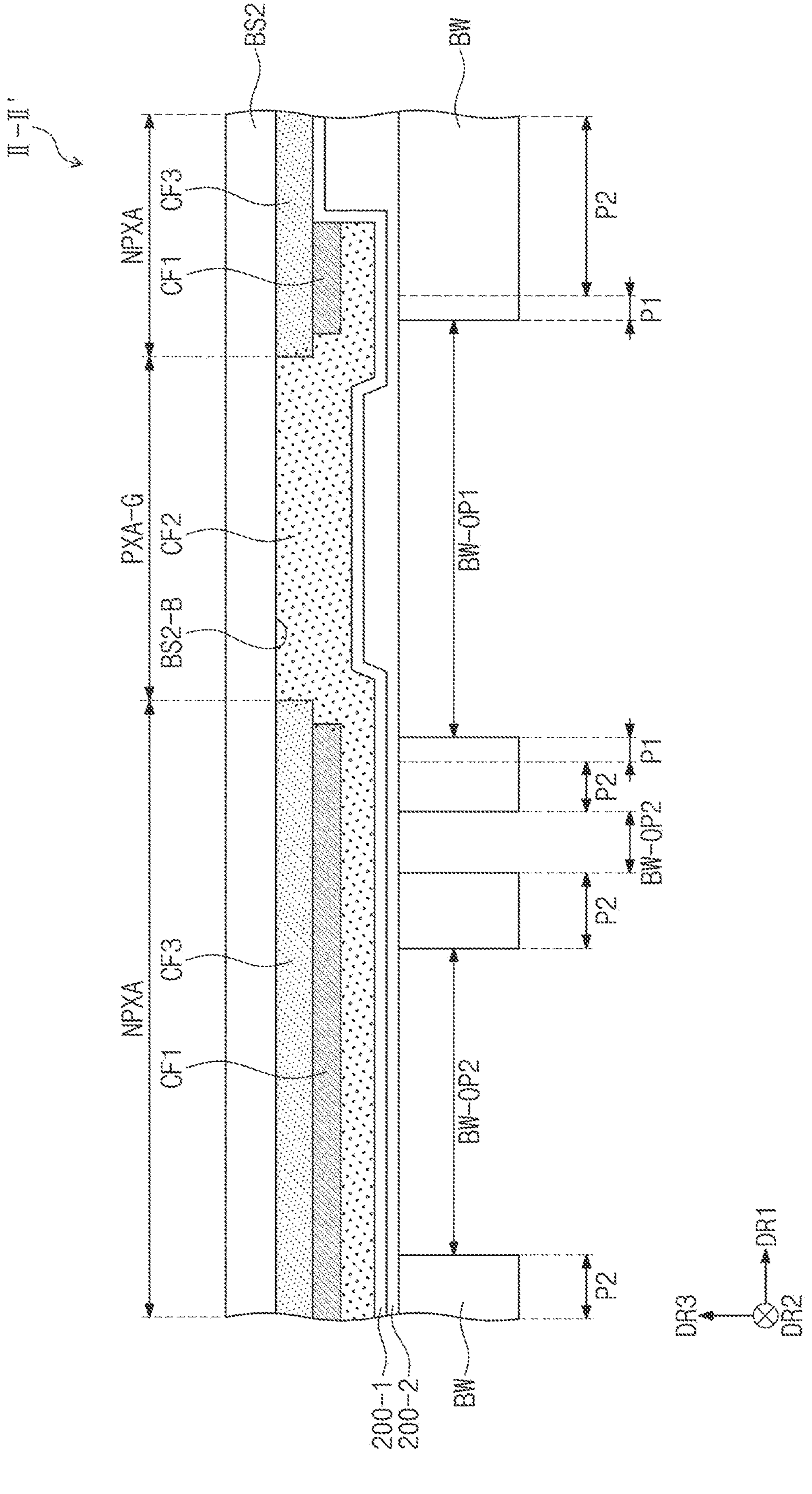
FIG. 4B is a cross-sectional view illustrating a portion of a display panel including a cross-section corresponding to the line II-II' of FIG. 4A.

FIG. 4A is a plan view illustrating a portion of a display panel DP according to an embodiment of the present disclosure. FIG. 4B is a cross-sectional view illustrating a portion of a display panel DP including a cross-section corresponding to the line II-II' of FIG. 4A. FIGS. 4A and 4B will be described with reference to FIGS. 3A and 3B, and duplicate descriptions of the same components as those described in FIGS. 3A and 3B will not be provided.

FIG. 4A illustrates the lower surface BW-B of the barrier rib BW, the plurality of first openings BW-OP1, a spacer SPC, and a plurality of second openings BW-OP2.

For example, FIG. 4A illustrates a structure further including the plurality of second openings BW-OP2 and the spacer SPC compared to the one shown in FIG. 3A. FIG. 4A is a plan view looking at the display panel DP along the third direction DR3 from the cell gap (see FIG. 2). The lower surface BW-B of the barrier rib BW may be defined as the surface that faces the thin film encapsulation layer TFE (see FIG. 2).

Referring to FIGS. 2, 4A, and 4B, the plurality of second openings BW-OP2 may be defined in the second portion P2 of the barrier rib BW, and may non-overlap (e.g., may not overlap) the plurality of light emitting regions EA1, EA2, and EA3. Each of the plurality of second openings BW-OP2 may overlap the first color filter CF1, the second color filter CF2, or the third color filter CF3. Compositions utilized in forming the first to third optical patterns CF1, CF2, and CF3 may not be provided to the plurality of second openings BW-OP2. For example, the plurality of second openings BW-OP2 may be empty spaces. FIG. 4B illustrates the first opening BW-OP1 corresponding to the second color filter CF2 and having the second optical pattern WC2 formed therein as an example.

The display panel DP may further include the spacer SPC. One spacer SPC is illustrated in FIG. 4A, but the number of spacers SPC is not particularly limited thereto. In some embodiments, the number of spacers SPC may be two or more. The spacer SPC may have a structure protruding towards the display element layer EL. The spacer SPC may be a structure provided to maintain a distance of the cell gap GAP. In some embodiments, the spacer SPC may have a structure further protruding from the barrier rib BW towards the display element layer EL. The spacer SPC may be provided utilizing the same material as the barrier rib BW, and may have a single body structure with the barrier rib BW. However, the embodiment of the present disclosure is not limited thereto, and the spacer SPC may be a structure additionally disposed on the lower surface BW-B of the barrier rib BW.

The barrier rib BW may be defined as the first portion P1 and the second portion P2. The first portion P1 may be defined as the portion around (e.g., surrounding) the plurality of first openings BW-OP1. The second portion P2 may surround the plurality of second openings BW-OP2. The second portion P2 may be defined as the portion spaced apart from the plurality of first openings BW-OP1 with the first portion P1 therebetween, a portion around (e.g., surrounding) the plurality of second openings BW-OP2, and a portion in which the spacer SPC is disposed.

The second portion P2 may be less liquid repellent than the first portion P1. When ink IK is landed (e.g., deposited) onto the barrier rib BW instead of the first opening BW-OP1 defined in the barrier rib BW, the ink IK may be spread due to the second portion P2 which is relatively less liquid repellent. For example, the ink IK landed onto the second portion P2 may form a partial sphere shape having a large radius of curvature, and a height formed by the ink IK on the barrier rib BW may be reduced. Accordingly, in a subsequent bonding process, a gap defect in upper and lower plates or cracks of a thin film encapsulation layer may be less likely to happen or may be prevented or reduced.

In some embodiments, the plurality of second openings BW-OP2 non-overlapping (not overlapping) the light emitting regions EA1, EA2, and EA3 are further defined in the barrier rib BW, and the second portion P2 may be adjacent to the plurality of second openings BW-OP2. Accordingly, the ink IK landed onto the barrier rib BW adjacent to the second openings BW-OP2 may be accommodated in the plurality of second openings BW-OP2. In this case, the mislanded ink IK does not remain on the barrier rib BW, so that a height difference formed by the ink IK (e.g., on the barrier rib BW) may not occur.

Figure 5:
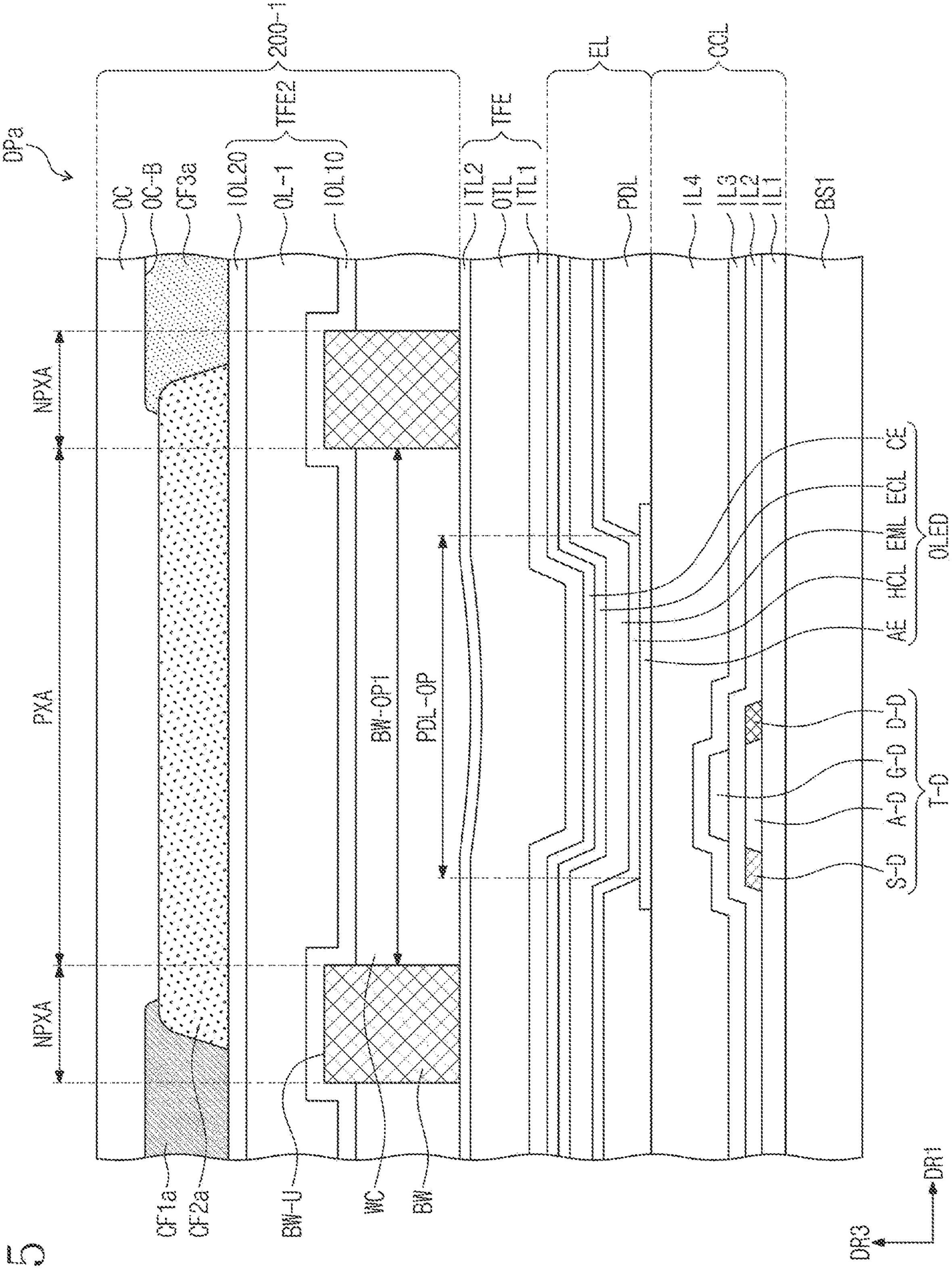
FIG. 5 is a cross-sectional view of a display panel according to an embodiment of the present disclosure.

FIG. 5 is a cross-sectional view of a display panel DPa according to an embodiment of the present disclosure. FIG. 5 will be described with reference to FIG. 2, and duplicate descriptions of the same components as those described in FIG. 2 will not be provided.

Referring to FIG. 5, the display region DA (see FIG. 1A) includes a pixel region PXA and a peripheral region NPXA. The pixel region PXA is defined to correspond to the pixel PX (see FIG. 1A). The peripheral region NPXA sets a boundary between the plurality of pixel regions PXA and prevents or reduces color mixing between the pixel regions PXA. In the present embodiment, the pixel region PXA is defined to correspond to the first opening BW-OP1. The peripheral region NPXA may be defined as the region in which the barrier rib BW is disposed.

The plurality of pixel regions PXA may include a first pixel region providing a first color light (e.g., red light), a second pixel region providing a second color light (e.g., green light), and a third pixel region providing a third color light (e.g., blue light). The three colors (e.g., main three colors) may be changed in other combinations, and the embodiment is not particular limited. The pixel region PXA of FIG. 5 is described as a first pixel region providing red light. As the cross-sectional structures of the first pixel region, the second pixel region, and the third pixel region are substantially the same, the first pixel region will be mainly described.

Referring to FIG. 5, a cross-section of the display panel DPa corresponding to the driving transistor T-D and the light emitting element OLED is illustrated as an example. The display panel DPa may include a plurality of insulating layers, semiconductor patterns, conductive patterns, and/or signal lines. An insulating layer, a semiconductor layer, and/or a conductive layer may be formed through processes such as coating or deposition. Thereafter, the insulating layer, the semiconductor layer, and/or the conductive layer may be selectively patterned through photolithography and etching. Semiconductor patterns, conductive patterns, signal lines, and/or the like included in the circuit layer CCL and the display element layer EL may be formed through such processes described above.

The display element layer EL includes the pixel defining film PDL. In some embodiments, the pixel defining film PDL may be an organic layer. The pixel defining film PDL may include a typical black coloring agent. The pixel defining film PDL may include a black dye and/or a black pigment mixed with a base resin. In an embodiment, the black coloring agent may include carbon black, a metal such as chromium, or an oxide thereof.

The first electrode AE may be disposed on the fourth insulating layer IL4. The first electrode AE is directly connected to the driving transistor T-D or is connected through another structure (e.g., a transistor). In FIG. 5, a connection structure between the first electrode AE and the driving transistor T-D is not illustrated. A pixel defining film opening PDL-OP is defined in the pixel defining film PDL. The pixel defining film opening PDL-OP exposes at least a portion of the first electrode AE. The pixel defining film opening PDL-OP may correspond to the light emitting region of the display element layer EL.

The second display substrate 200-1 may be disposed on the thin film encapsulation layer TFE. The second display substrate 200-1 may include the barrier rib BW, the optical pattern WC, an upper encapsulation layer TFE2, a plurality of color filters CF1a, CF2a, and CF3a, and a protection layer OC.

The barrier rib BW may include a base resin and an additive. The base resin may be formed of one or more suitable resin compositions that may be generally referred to as binders. The additive may include a coupling agent and/or a photo-initiator. The additive may further include a dispersant. The barrier rib BW may include a black coloring agent to block or reduce light. The barrier rib BW may include a black dye and/or a black pigment mixed with a base resin. In an embodiment, the black coloring agent may include carbon black, a metal such as chromium, or an oxide thereof.

One surface of the barrier rib BW, which faces the upper encapsulation layer TFE2, may be defined as an upper surface BW-U of the barrier rib BW. The first portion P1 (see FIG. 6) and the second portion P2 (see FIG. 6) may be defined on the upper surface BW-B of the barrier rib BW, which will be described in more detail later.

The first opening BW-OP1 corresponding to the pixel defining film opening PDL-OP is defined in the barrier rib BW. When viewed on a plane, the first opening BW-OP1 overlaps the pixel defining film opening PDL-OP and has a larger area than the pixel defining film opening PDL-OP.

The optical pattern WC is disposed inside the first opening BW-OP1. The optical pattern WC may change the optical properties of the source light. In order to provide light of a different color from the source light, the optical pattern WC of the first and second pixel regions may be a color conversion pattern for converting the color of the source light. In some embodiments, the color conversion pattern of the first pixel region may convert the source light of blue light into red light, and the color conversion pattern of the second pixel region may convert the source light of blue light into green light. The optical pattern WC of the third pixel region may be a transmission pattern. The optical pattern WC of the third pixel region includes scattering particles, and thus may scatter and then emit the received blue light. The optical pattern WC may improve the luminance of the emitted light with respect to the incident light.

The color conversion pattern may include a base resin and quantum dots mixed (or dispersed) with/in the base resin. In the present embodiment, the color conversion pattern may include quantum dots, and may be defined as a quantum dot pattern, and the color conversion patterns of the first pixel region and the second pixel region may include different quantum dots.

The optical pattern WC may be formed through an inkjet process. A liquid composition may be provided in the first opening BW-OP1.

The upper encapsulation layer TFE2 may be disposed on the barrier rib BW and the optical pattern WC. The upper encapsulation layer TFE2 may include a first inorganic encapsulation layer IOL10, an organic encapsulation layer OL-1, and a second inorganic encapsulation layer IOL20. The first and second inorganic encapsulation layers IOL10 and IOL20 may protect the optical pattern WC from external moisture, and the organic encapsulation layer OL-1 may remove steps defined by the barrier rib BW and the optical pattern WC, and provides a flat base surface to a member to be disposed on an upper side.

The first inorganic encapsulation layer IOL10 and the second inorganic encapsulation layer IOL20 may include at least one of silicon oxide, silicon oxynitride, or silicon nitride. The organic encapsulation layer OL-1 may include an organic material, for example, an acrylic organic material.

The plurality of color filters CF1a, CF2a, and CF3a may be disposed on the upper encapsulation layer TFE2. The plurality of color filters CF1a, CF2a, and CF3a transmit light in a specific wavelength range and block or reduce light outside the corresponding wavelength range. In some embodiments, the first color filter CF1a may be to transmit red light and block or reduce green light and blue light, and the second color filter CF2a may be to transmit green light and block or reduce red light and blue light. The third color filter CF3a may be to transmit blue light.

The plurality of color filters CF1a, CF2a, and CF3a disposed on the flat surface after removing steps through the organic encapsulation layer OL-1 may have a substantially uniform thickness in the pixel region PXA. The red light, the green light, or the blue light generated in the optical pattern WC may have substantially uniform luminance in the pixel region PXA and may be provided to the outside.

The protection layer OC may be disposed on the plurality of color filters CF1a, CF2a, and CF3a. A surface of the protection layer OC in contact with the plurality of color filters CF1a, CF2a, and CF3a may be defined as a lower surface OC-B of the protection layer OC. The lower surface OC-B of the protection layer OC in contact with the plurality of color filters CF1a, CF2a, and CF3a may be curved to correspond to the shapes of the plurality of color filters CF1a, CF2a, and CF3a.

The protection layer OC may be an organic layer protecting the plurality of color filters CF1a, CF2a, and CF3a. The protection layer OC may include (e.g., may be formed of a composition that include) a photo-curable organic material or a heat-curable organic material. A protective glass substrate may be further disposed on the protection layer OC. An adhesive layer may be disposed between the protection layer OC and the glass substrate. In an embodiment of the present disclosure, the protection layer OC may include an inorganic material.

Figure 6:
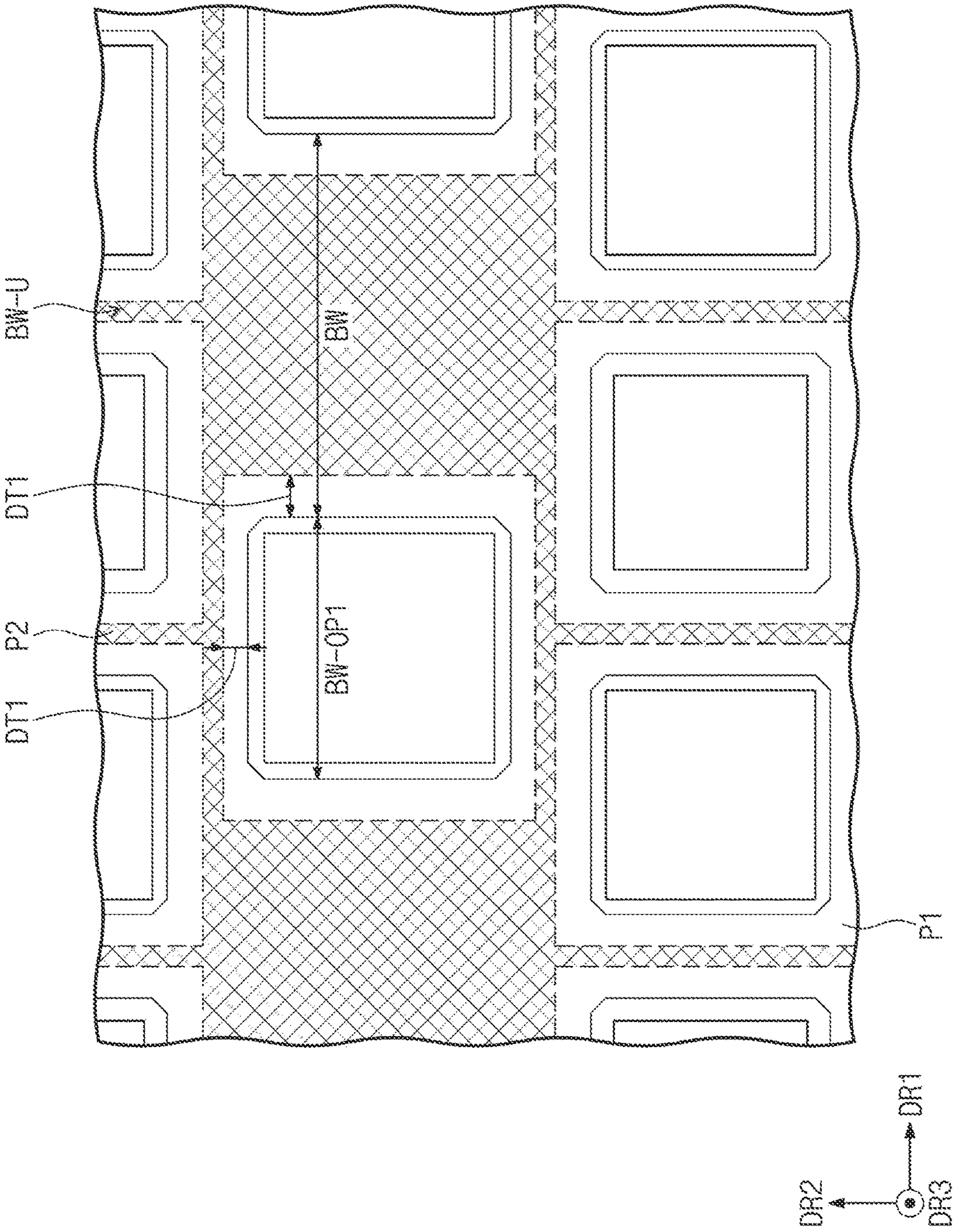
FIG. 6 is a plan view illustrating a portion of a display panel according to an embodiment of the present disclosure.

FIG. 6 is a plan view illustrating a portion of a display panel DPa according to an embodiment of the present disclosure. FIG. 6 will be described with reference to FIG. 3A, and duplicate descriptions of the same components as those described in FIG. 3A will not be provided.

FIG. 6 illustrates the upper surface BW-U of the barrier rib BW and the plurality of first openings BW-OP1. FIG. 6 is a plan view looking at the display panel DPa along a direction opposite to the third direction DR3. The upper surface BW-U of the barrier rib BW may be defined as the surface that faces the upper encapsulation layer TFE2.

Referring to FIGS. 5 and 6, the barrier rib BW may be defined as the first portion P1 and the second portion P2. The first portion P1 and the second portion P2 may be defined on the upper surface BW-U of the barrier rib BW, which faces the upper encapsulation layer TFE2. The first portion P1 may be defined as the portion around (e.g., surrounding) the plurality of first openings BW-OP1. The second portion P2 may be defined as the portion spaced apart from the plurality of first openings BW-OP1 with the first portion P1 therebetween.

The second portion P2 may be less liquid repellent than the first portion P1. When the ink IK is landed (e.g., deposited) onto the barrier rib BW instead of the first opening BW-OP1 defined in the barrier rib BW, the ink IK may be spread due to the second portion P2 which is relatively less liquid repellent. For example, the ink IK landed onto the second portion P2 may form a partial sphere shape having a large radius of curvature, and a height formed by the ink IK on the barrier rib BW may be reduced. Accordingly, in a subsequent bonding process, a gap defect in upper and lower plates or cracks of a thin film encapsulation layer may be less likely to happen or may be prevented or reduced.

In some embodiments, the first portion P1 which is relatively more liquid repellent may be positioned adjacent to the plurality of first openings BW-OP1. Therefore, even when coating liquid supplied to the first opening BW-OP1 is landed (e.g., deposited) onto the upper surface of the first portion P1 of the barrier rib BW, it may not move to another portion (e.g., region). Accordingly, defects in which the coating liquid flows out to another adjacent first opening BW-OP1 supplied with a different type or kind of coating liquid may be reduced.

Figure 7A:
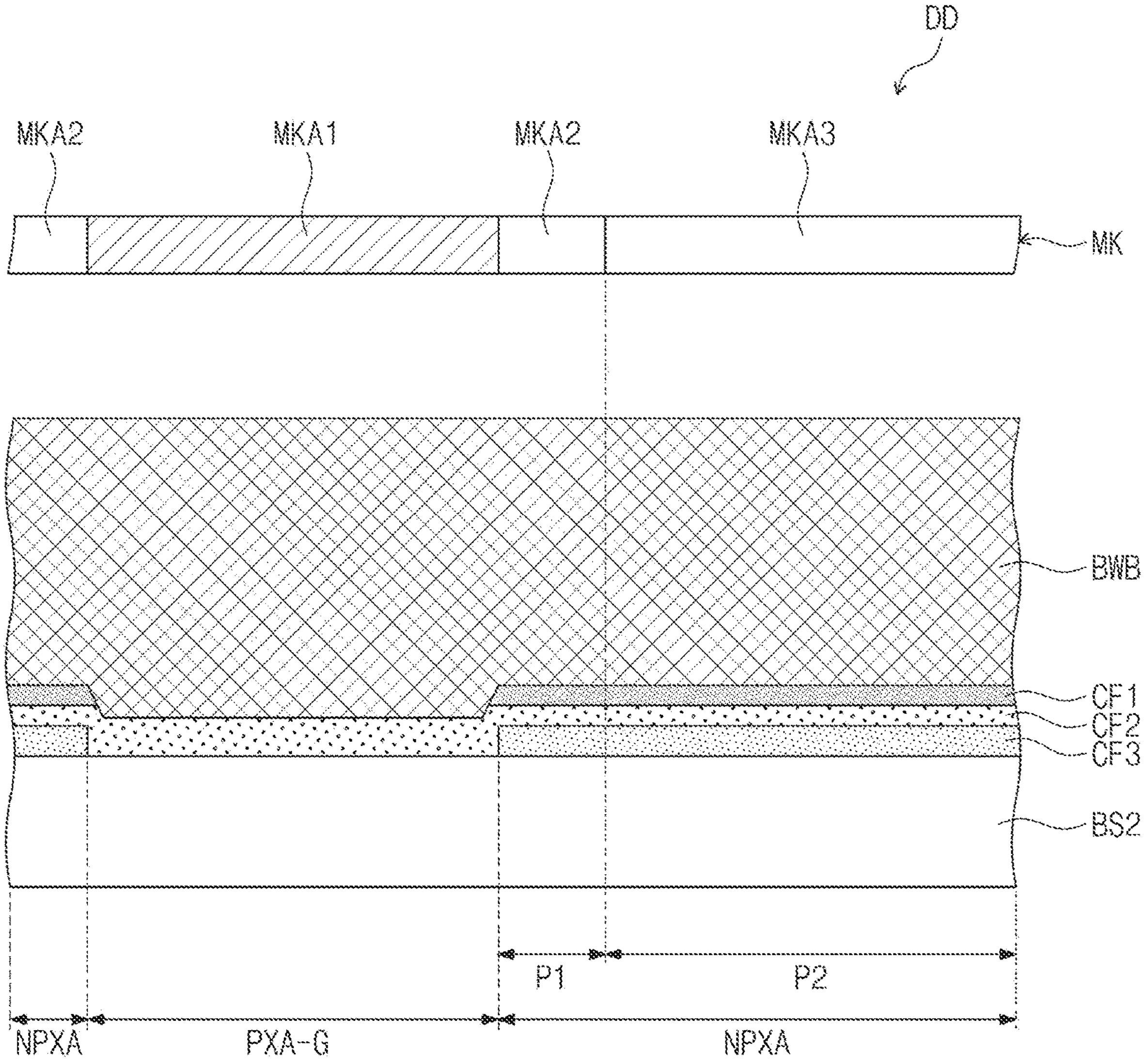
FIGS. 7A to 7C are views schematically illustrating a method for manufacturing a display device according to an embodiment of the present disclosure.
Figure 7B:
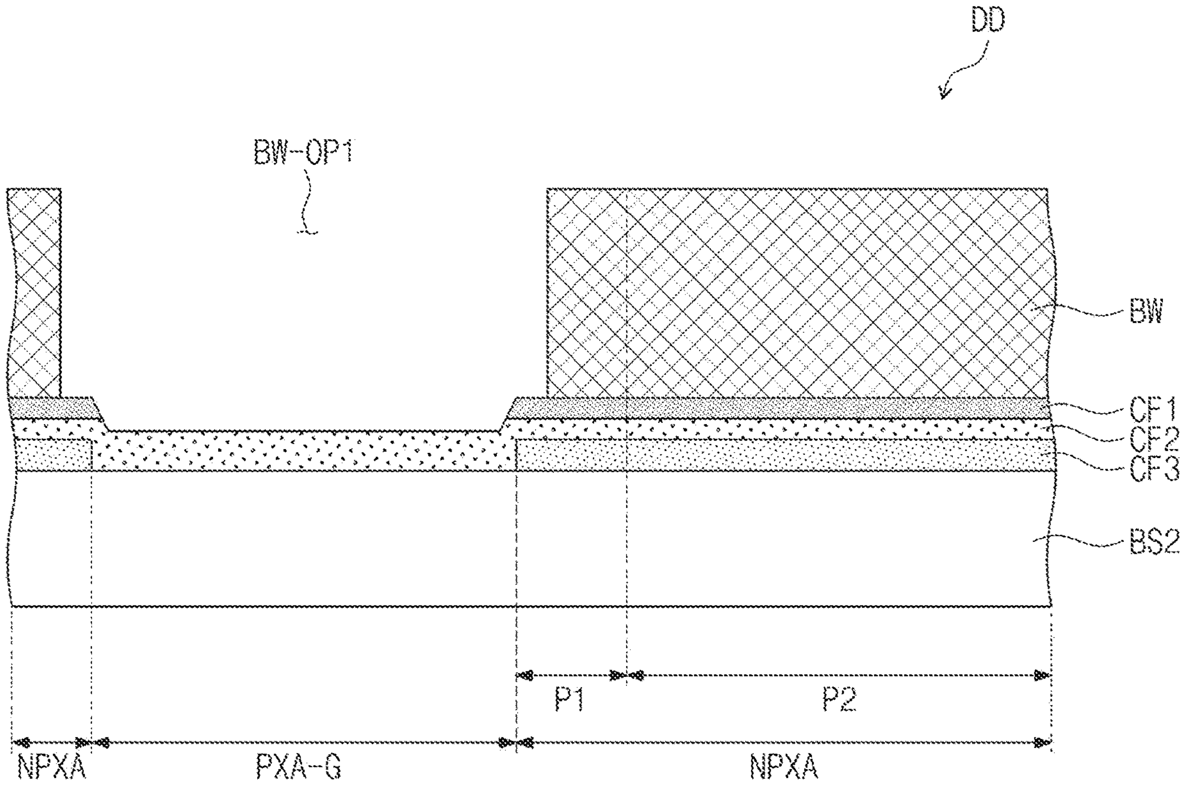
Figure 7C:
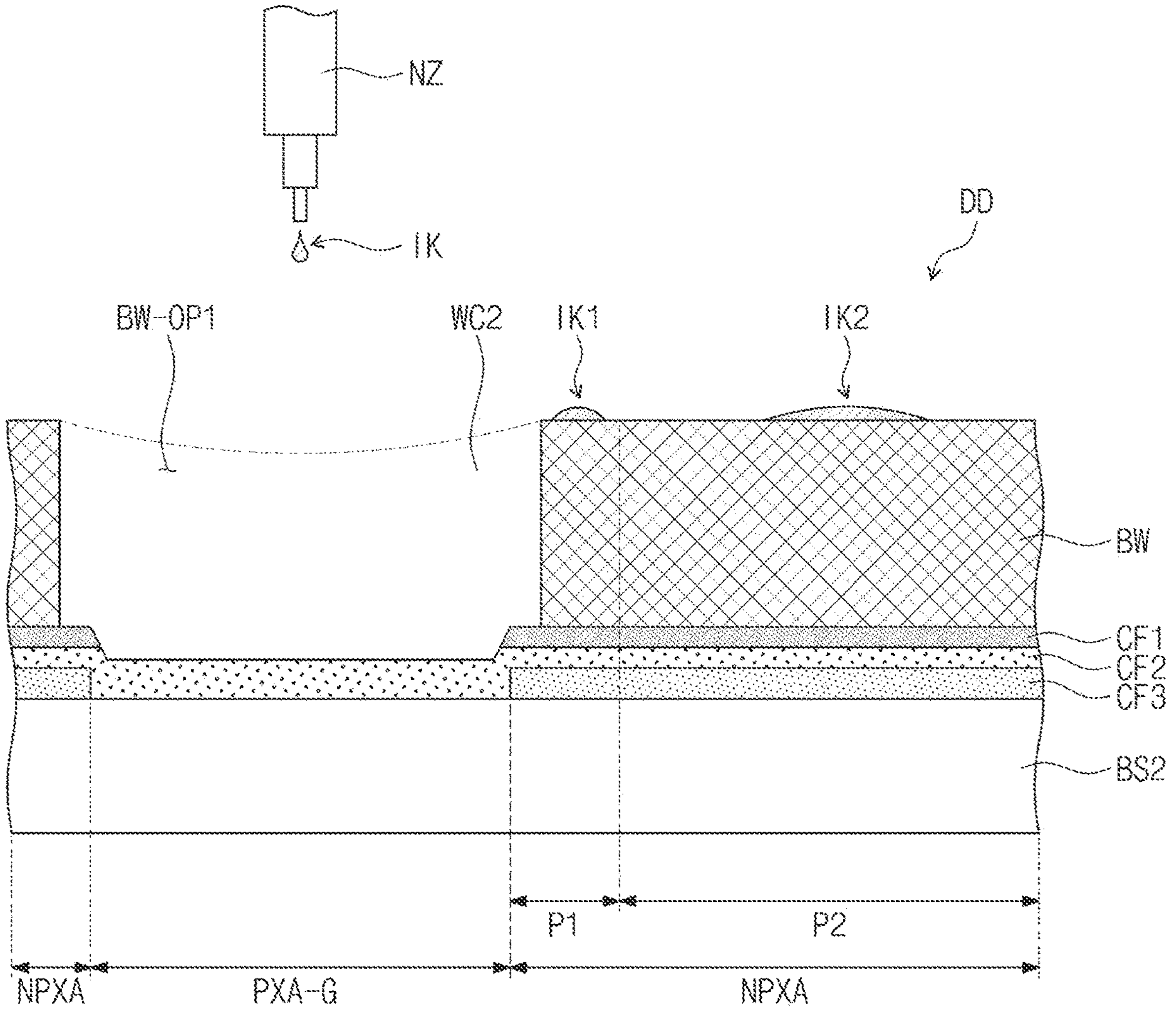

FIGS. 7A to 7C are views schematically illustrating a method for manufacturing a display device DD according to an embodiment of the present disclosure.

Referring to FIGS. 2 and 7A to 7C, the method for manufacturing the display device DD may include forming the barrier rib BW in which the plurality of first openings BW-OP1 are defined, forming the plurality of optical patterns WC1, WC2, and WC3 disposed in the plurality of first openings BW-OP1, and forming the display element layer EL.

The forming of the barrier rib BW may include forming a barrier rib layer BWB, aligning a mask MK, and patterning the barrier rib layer BWB to form the plurality of first openings BW-OP1.

Referring to FIG. 7A, the first color filter CF1, the second color filter CF2, and the third color filter CF3 may be formed on one surface of the second base layer BS2. Thereafter, the barrier rib layer BWB covering the first to third color filters CF1, CF2, and CF3 is formed on the first to third color filters CF1, CF2, and CF3.

For example, after the forming of the color filters CF1, CF2, and CF3, the barrier rib layer BWB is formed thereon. Thereafter, the mask MK is aligned on the barrier rib layer BWB.

The mask MK may include a first mask region MKA1, a second mask region MKA2, and a third mask region MKA3. The first mask region MKA1 may have a property of blocking light as a light blocking material is applied thereto, and the second mask region MKA2 may have a property of transmitting light. The third mask region MKA3 may have a property of blocking at least a portion of the light.

The first mask region MKA1 may be disposed in a region corresponding to any one of the plurality of color filters CF1, CF2, and CF3. In some embodiments, the first mask region MKA1 may be aligned in a portion overlapping the second pixel region PXA-G. The second mask region MKA2 and the third mask region MKA3 may be disposed in a region overlapping all of the plurality of color filters CF1, CF2, and CF3. In some embodiments, the second mask region MKA2 and the third mask region MKA3 may be aligned to overlap the peripheral region NPXA.

Referring to FIGS. 7A and 7B, a portion of the barrier rib layer BWB corresponding to the first mask region MKA1 may be removed to form the first opening BW-OP1. A portion of the barrier rib layer BWB corresponding to the second mask region MKA2 and the third mask region MKA3 may correspond to the barrier rib BW.

The barrier rib layer BWB may be patterned to form the plurality of first openings BW-OP1. The patterning may further include exposing the barrier rib layer BWB in a condition that the mask MK is aligned with the barrier rib layer BWB. According to an embodiment of the present disclosure, in the exposure process, a portion of the barrier rib layer BWB, which receives light, may be cured, and a portion of the barrier rib layer BWB, which does not receive light, may be removed.

The barrier rib BW may include the first portion P1 and the second portion P2. The first portion P1 may be a portion of the barrier rib BW adjacent to the first opening BW-OP1, and the second portion P2 may be another portion of the barrier rib BW spaced apart from the first opening BW-OP1.

The first portion P1 may overlap the second mask region MKA2, and the second portion P2 may overlap the third mask region MKA3. The second mask region MKA2 transmits light entirely and the third mask region MKA3 transmits only a portion (and not all) of the light, and thus, an amount of light exposure of the first portion P1 exposed through the second mask region MKA2 may be greater than an amount of light exposure of the second portion P2 exposed through the third mask region MKA3. The larger the exposure amount, the greater the liquid repellent property, and the smaller the exposure amount, the smaller the liquid repellent property. For example, the first portion P1 may be more liquid repellent than the second portion P2. The first portion P1 and the second portion P2 have different exposure amounts, but the upper surface of the first portion P1 and the upper surface of the second portion P2 may be aligned with each other (e.g., may be on the same plane).

FIGS. 7A to 7C illustrate the second pixel region PXA-G as an example, but the first opening BW-OP1 overlapping the first pixel region PXA-R and the third pixel region PXA-B may also be formed in substantially the same manner.

FIG. 7C illustrates forming the second optical pattern WC2 disposed in the plurality of first openings BW-OP1. The composition (e.g., ink composition) IK may be provided to the first opening BW-OP1 utilizing an inkjet process. An inkjet head may include a nozzle that provides the composition IK. The inkjet head may provide (e.g., deposit) the composition IK to the first opening BW-OP1 while moving in a set or predetermined direction. When the composition IK is dried, the second optical pattern WC2 may be formed. FIG. 7C illustrates the second optical pattern WC2 as an example, but the first optical pattern WC1 and/or the third optical pattern WC3 may also be formed through the same process.

In the process of providing the composition IK (or ink) through the inkjet process, the composition IK may be landed (e.g., deposited) onto the barrier rib BW instead of the first opening BW-OP1. When the ink is landed onto the barrier rib BW instead of the first opening BW-OP1, the ink may be spread due to the second portion P2 which is relatively less liquid repellent. For example, the ink landed onto the second portion may form a partial sphere shape having a large radius of curvature, and a height formed by the ink on the barrier rib BW may be reduced. Accordingly, in a subsequent bonding process, a gap defect in upper and lower plates or cracks of a thin film encapsulation layer may be less likely to happen or may be prevented or reduced.

In order to describe the difference in liquid repellent properties between the first portion P1 and the second portion P2, the ink IK1 landed onto the first portion P1 and the ink IK2 landed onto the second portion P2 are illustrated. The ink IK1 landed in a region which is more liquid repellent may have a partial sphere shape having a relatively smaller radius of curvature, and the ink IK2 landed in a region which is less liquid repellent may have a partial sphere shape having a relatively larger radius of curvature.

The first portion P1 may be more liquid repellent than the second portion P2. The first portion P1 is adjacent to the first opening BW-OP1 and is relatively more liquid repellent, and thus, even when the coating liquid supplied to the first opening BW-OP1 is landed onto an upper surface of the first portion P1 of the barrier rib BW, it may not move to another portion (e.g., region). Accordingly, a defect in which the coating liquid flows out to another adjacent first opening BW-OP1 supplied with a different type or kind of coating liquid may be reduced.

After the forming of the plurality of optical patterns WC1, WC2, and WC3, forming the display element layer EL may be performed. After the forming of the display element layer EL, bonding the display element layer EL, the barrier rib BW, and the plurality of optical patterns WC1, WC2, and WC3 may be performed.

Figure 8A:
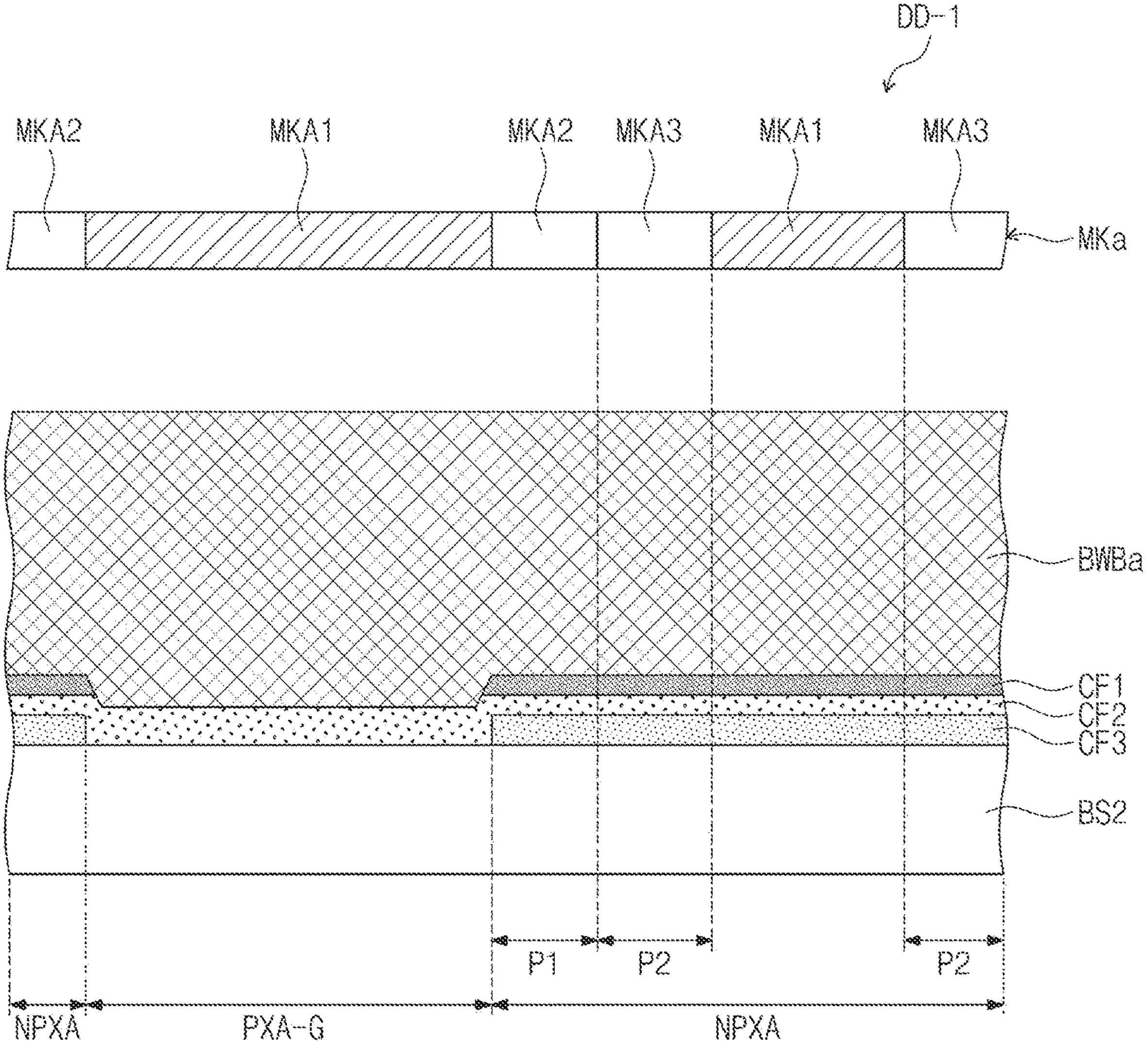
FIGS. 8A to 8C are views schematically illustrating a method for manufacturing a display device according to an embodiment of the present disclosure.
Figure 8B:
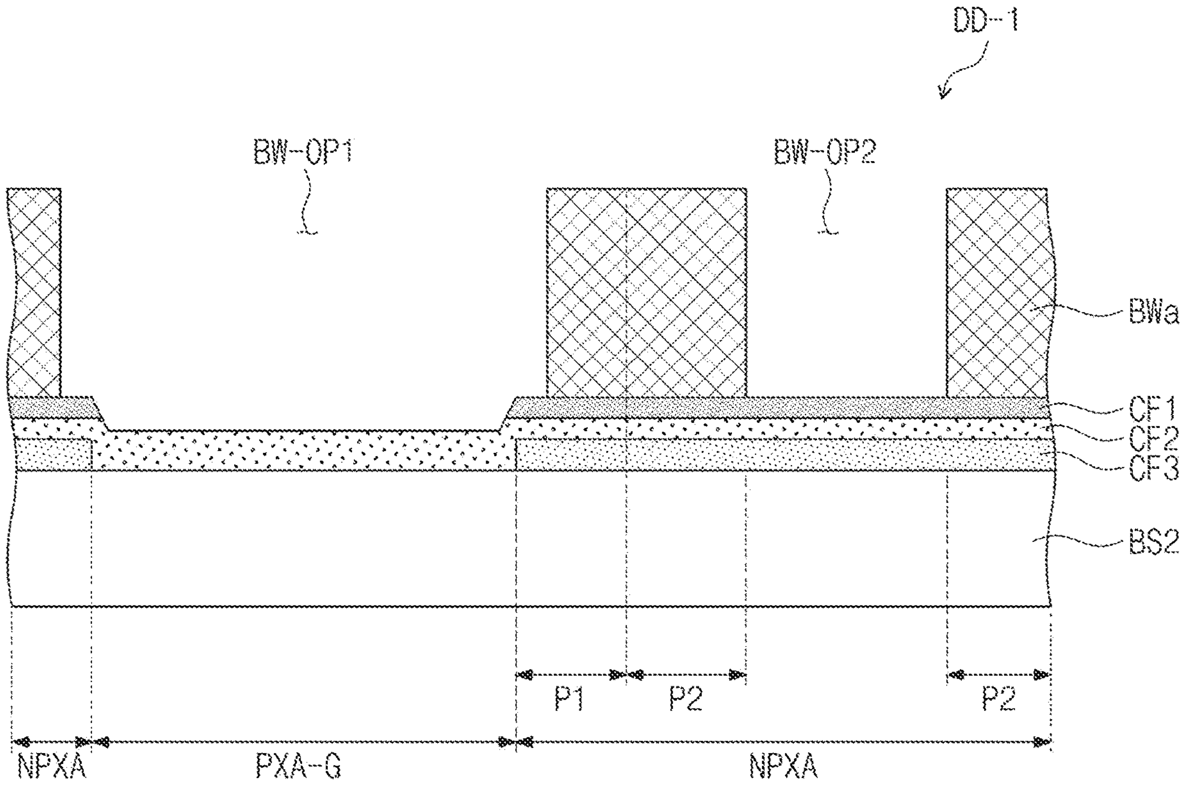
Figure 8C:
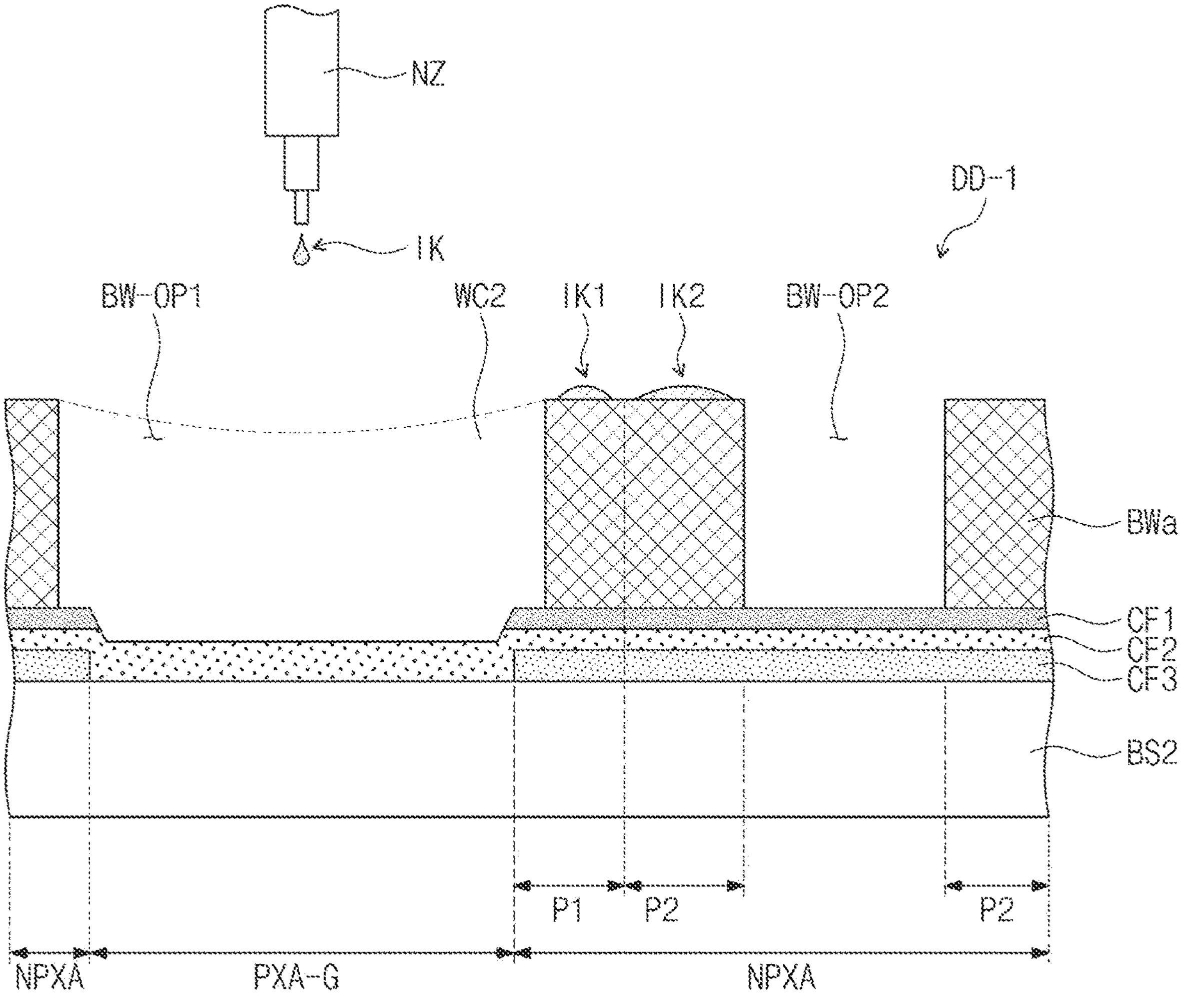

FIGS. 8A to 8C are views schematically illustrating a method for manufacturing a display device DD-1 according to an embodiment of the present disclosure.

Referring to FIGS. 2 and 8A to 8C, the method for manufacturing the display device DD-1 may include forming a barrier rib BWa in which the plurality of first openings BW-OP1 and the plurality of second openings BW-OP2 spaced apart from the plurality of first openings BW-OP1 are defined, forming the plurality of optical patterns WC1, WC2, and WC3 disposed in the plurality of first openings BW-OP1, and forming the display element layer EL.

The forming of the barrier rib BWa may include forming a barrier rib layer BWBa, aligning a mask MKa, and patterning the barrier rib layer BWBa to form the plurality of first openings BW-OP1 and the plurality of second openings BW-OP2.

Referring to FIG. 8A, the first color filter CF1, the second color filter CF2, and the third color filter CF3 may be formed on one surface of the second base layer BS2. Thereafter, the barrier rib layer BWBa covering the first to third color filters CF1, CF2, and CF3 is formed on the first to third color filters CF1, CF2, and CF3.

For example, after the forming of the color filters CF1, CF2, and CF3, the barrier rib layer BWBa is formed thereon. Thereafter, the mask MKa is aligned on the barrier rib layer BWBa.

The mask MKa may include a first mask region MKA1, a second mask region MKA2, and a third mask region MKA3. The first mask region MKA1 may have a property of blocking light as a light blocking material is applied thereto, and the second mask region MKA2 may have a property of transmitting light. The third mask region MKA3 may have a property of blocking at least a portion of the light.

The first mask region MKA1 may be disposed in a region corresponding to at least one of the plurality of color filters CF1, CF2, and CF3. In some embodiments, the first mask region MKA1 may be aligned in a portion overlapping the second pixel region PXA-G, or in a portion overlapping a region other than the first portion P1 and the second portion P2 of the peripheral region NPXA. The second mask region MKA2 and the third mask region MKA3 may be disposed in a region overlapping all of the plurality of color filters CF1, CF2, and CF3. In some embodiments, the second mask region MKA2 and the third mask region MKA3 may be aligned in a portion overlapping the first portion P1 and the second portion P2 of the peripheral region NPXA respectively.

Referring to FIGS. 8A and 8B, a portion of the barrier rib layer BWBa corresponding to the first mask region MKA1 may be removed to form the first opening BW-OP1 or the second opening BW-OP2. A portion of the barrier rib layer BWBa corresponding to the second mask region MKA2 or the third mask region MKA3 may correspond to the barrier rib BWa.

The barrier rib layer BWBa may be patterned to form the plurality of first openings BW-OP1 and the plurality of second openings BW-OP2. The patterning may further include exposing the barrier rib layer BWBa in a condition that the mask MKa is aligned with the barrier rib layer BWBa. According to an embodiment of the present disclosure, in the exposure process, a portion of the barrier rib layer BWBa, which receives light, may be cured, and a portion of the barrier rib layer BWBa, which does not receive light, may be removed.

The barrier rib BWa may include the first portion P1 and the second portion P2. The first portion P1 may be a portion of the barrier rib BWa adjacent to the first opening BW-OP1, and the second portion P2 may be another portion of the barrier rib BWa spaced apart from the first opening BW-OP1 and adjacent to the second opening BW-OP2.

The first portion P1 may overlap the second mask region MKA2, and the second portion P2 may overlap the third mask region MKA3. The second mask region MKA2 transmits light entirely and the third mask region MKA3 transmits only a portion (and not all) of the light, and thus, an amount of light exposure of the first portion P1 exposed through the second mask region MKA2 may be greater than an amount of light exposure of the second portion P2 exposed through the third mask region MKA3. The larger the exposure amount, the greater the liquid repellent property, and the smaller the exposure amount, the smaller the liquid repellent property. For example, the first portion P1 may be more liquid repellent than the second portion P2. The first portion P1 and the second portion P2 have different exposure amounts, but the upper surface of the first portion P1 and the upper surface of the second portion P2 may be aligned with each other (e.g., may be on the same plane).

FIGS. 8A to 8C illustrate the second pixel region PXA-G as an example, but the first opening BW-OP1 overlapping the first pixel region PXA-R and the third pixel region PXA-B may also be formed in substantially the same manner.

FIG. 8C illustrates forming a plurality of optical patterns WC2 disposed in the plurality of first openings BW-OP1. The composition (e.g., ink composition) IK may be provided to the first opening BW-OP1 utilizing an inkjet process. An inkjet head may include a nozzle that provides the composition IK. The inkjet head may provide (e.g., deposit) the composition IK to the first opening BW-OP1 while moving in a set or predetermined direction. When the composition IK is dried, the second optical pattern WC2 may be formed. FIG. 8C illustrates the second optical pattern WC2 as an example, but the first optical pattern WC1 and/or the third optical pattern WC3 may also be formed through the same process.

In the process of providing the composition IK through the inkjet process, the composition IK (or ink) may be landed (e.g., deposited) onto the barrier rib BWa or the second opening BW-OP2 instead of the first opening BW-OP1. When the ink is landed onto the barrier rib BWa instead of the first opening BW-OP1, the ink may be spread due to the second portion P2 which is relatively less liquid repellent. For example, the ink landed onto the second portion P2 may form a partial sphere shape having a large radius of curvature, and a height formed by the ink on the barrier rib BWa may be reduced. Accordingly, in a subsequent bonding process, a gap defect in upper and lower plates or cracks of a thin film encapsulation layer may be less likely to happen or may be prevented or reduced.

In order to describe the difference in liquid repellent properties between the first portion P1 and the second portion P2, the ink IK1 landed onto the first portion P1 and the ink IK2 landed onto the second portion P2 are illustrated. The ink IK1 landed in a region which is more liquid repellent may have a partial sphere shape having a relatively smaller radius of curvature, and the ink IK2 landed in a region which is less liquid repellent may have a partial sphere shape having a relatively large radius of curvature.

In some embodiments, the ink landed onto the barrier rib BWa adjacent to the plurality of second openings BW-OP2 may be accommodated in the plurality of second openings BW-OP2. In this case, the mislanded ink does not remain on the barrier rib BWa, so that a height difference formed by the ink on the barrier rib BWa may not occur.

The first portion P1 may be more liquid repellent than the second portion P2. The first portion P1 is adjacent to the first opening BW-OP1 and is relatively more liquid repellent, and thus, even when the coating liquid supplied to the first opening BW-OP1 is landed onto an upper surface of the first portion P1 of the barrier rib BWa, it may not move to another portion (e.g., region). Accordingly, a defect in which the coating liquid flows out to another adjacent first opening BW-OP1 supplied with a different type or kind of coating liquid may be reduced.

After the forming of the plurality of optical patterns WC1, WC2, and WC3, forming the display element layer EL may be performed. After the forming of the display element layer EL, bonding the display element layer EL, the barrier rib BWa, and the plurality of optical patterns WC1, WC2, and WC3 may be performed.

Figure 9A:
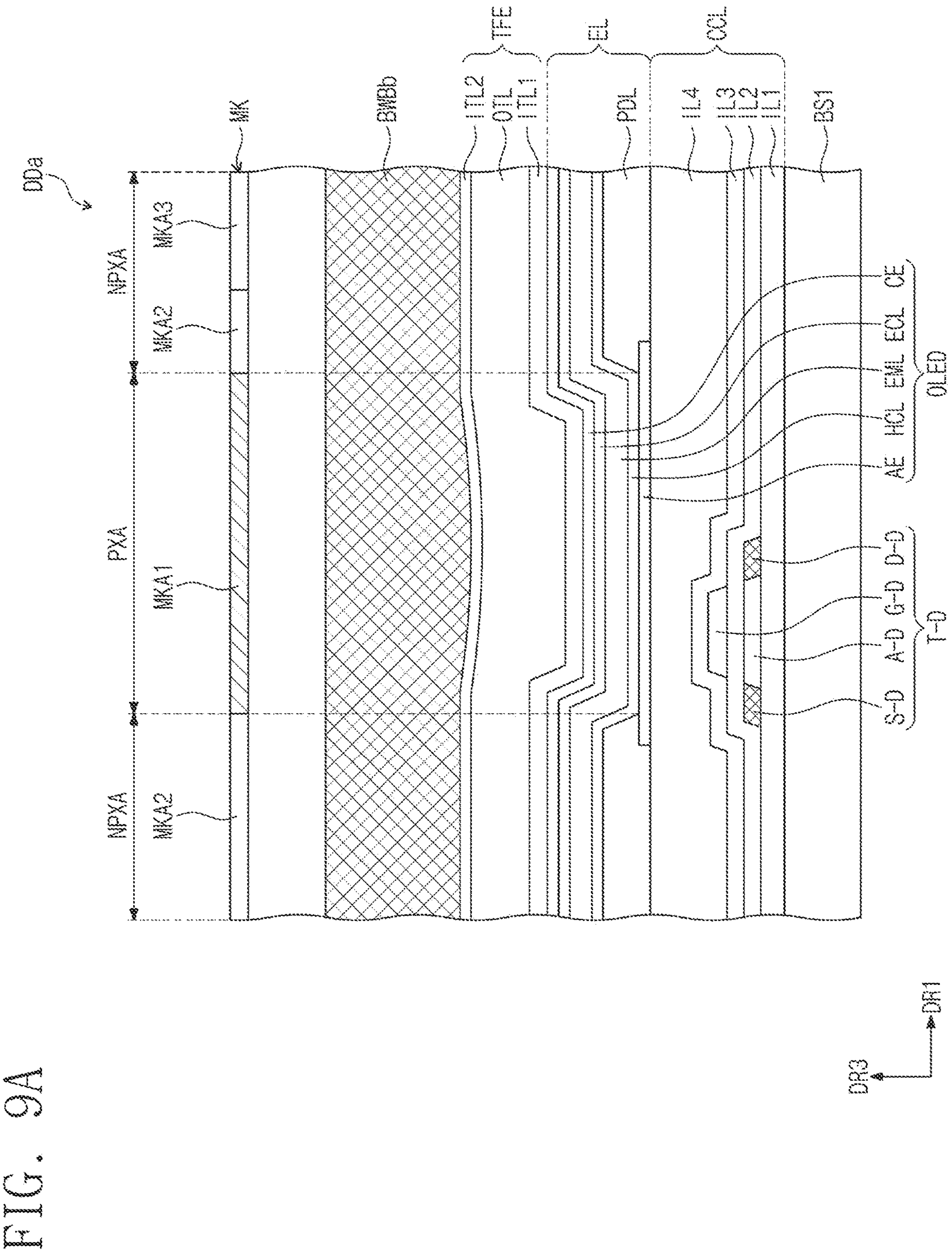
FIGS. 9A to 9C are views schematically illustrating a method for manufacturing a display device according to an embodiment of the present disclosure.
Figure 9B:
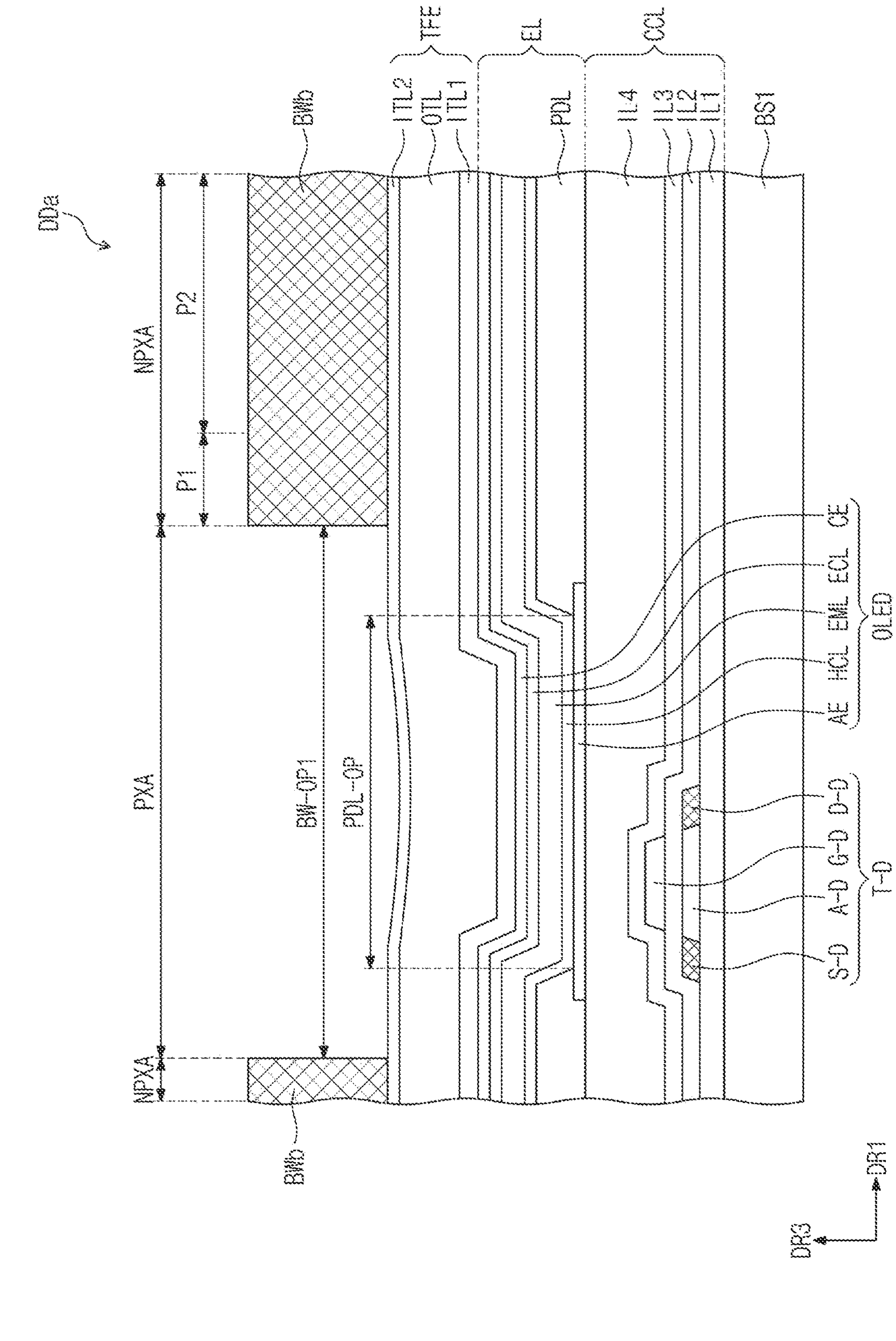
Figure 9C:
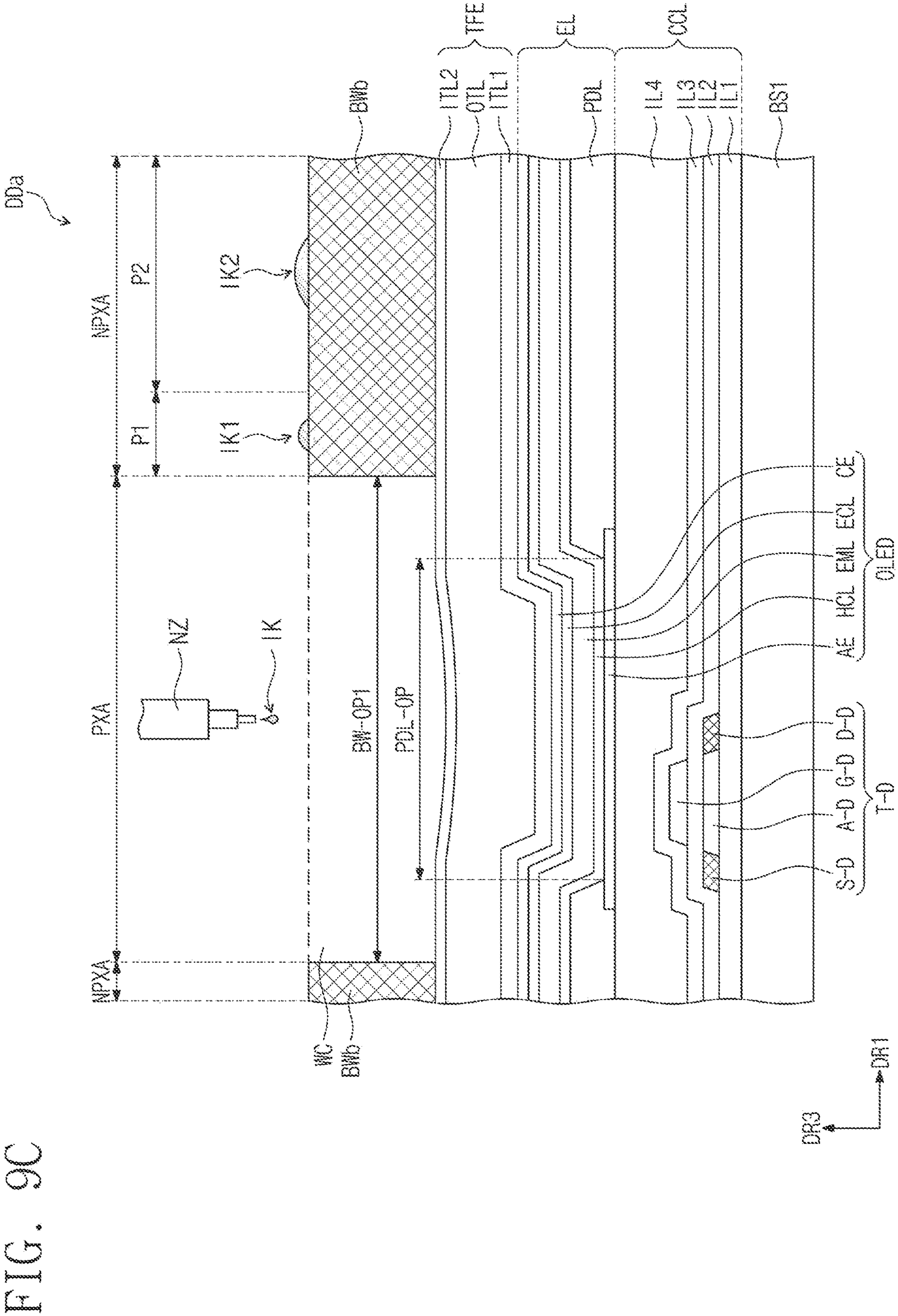

FIGS. 9A to 9C are views schematically illustrating a method for manufacturing a display device DDa according to an embodiment of the present disclosure.

Referring to FIGS. 5 and 9A to 9C, the method for manufacturing the display device DDa may include forming the display element layer EL, forming a barrier rib BWb in which the plurality of first openings BW-OP1 are defined, and forming the plurality of optical patterns WC disposed in the plurality of first openings BW-OP1.

The forming of the barrier rib BWb may include forming a barrier rib layer BWBb, aligning a mask MK, and patterning the barrier rib layer BWBb to form the plurality of first openings BW-OP1.

Referring to FIG. 9A, the circuit layer CCL, the display element layer EL, and the thin film encapsulation layer TFE may be formed on the first base layer BS1. Thereafter, the barrier rib layer BWBb is formed on the thin film encapsulation layer TFE. Then, the mask MK is aligned on the barrier rib layer BWBb.

The mask MK may include a first mask region MKA1, a second mask region MKA2, and a third mask region MKA3. The first mask region MKA1 may have a property of blocking light as a light blocking material is applied thereto, and the second mask region MKA2 may have a property of transmitting light. The third mask region MKA3 may have a property blocking at least a portion of the light.

The first mask region MKA1 may be aligned in a portion overlapping the pixel region PXA. The second mask region MKA2 and the third mask region MKA3 may be aligned to overlap the peripheral region NPXA.

Referring to FIGS. 9A and 9B, a portion of the barrier rib layer BWBb corresponding to the first mask region MKA1 may be removed to form the first opening BW-OP1. A portion of the barrier rib layer BWBb corresponding to the second mask region MKA2 and the third mask region MKA3 may correspond to the barrier rib BWb.

FIG. 9A illustrates that the first mask region MKA1 is disposed in a region corresponding to the pixel region PXA as an example. The pixel region PXA may be a first pixel region providing a first color light, a second pixel region providing a second color light, and a third pixel region providing a third color light. The first color light, the second color light, and the third color light may be light of different colors. In some embodiments, one of the first to third color lights may be green light, another may be red light, and the other may be blue light.

The barrier rib layer BWBb may be patterned to form the plurality of first openings BW-OP1. The patterning may further include exposing the barrier rib layer BWBb in a condition that the mask MK is aligned with the barrier rib layer BWBb. According to an embodiment of the present disclosure, in the exposure process, a portion of the barrier rib layer BWBb, which receives light, may be cured, and a portion of the barrier rib layer BWBb, which does not receive light, may be removed.

The barrier rib BWb may include the first portion P1 and the second portion P2. The first portion P1 may be a portion of the barrier rib BWb adjacent to the first opening BW-OP1, and the second portion P2 may be another portion of the barrier rib BWb spaced apart from the first opening BW-OP1.

The first portion P1 may overlap the second mask region MKA2, and the second portion P2 may overlap the third mask region MKA3. The second mask region MKA2 transmits light entirely and the third mask region MKA3 transmits only a portion (and not all) of the light, and thus, an amount of light exposure of the first portion P1 exposed through the second mask region MKA2 may be greater than an amount of light exposure of the second portion P2 exposed through the third mask region MKA3. The larger the exposure amount, the greater the liquid repellent property, and the smaller the exposure amount, the smaller the liquid repellent property. For example, the first portion P1 may be more liquid repellent than the second portion P2. The first portion P1 and the second portion P2 have different exposure amounts, but the upper surface of the first portion P1 and the upper surface of the second portion P2 may be aligned with each other (e.g., may be on the same plane).

FIG. 9C illustrates forming the plurality of optical patterns WC disposed in the plurality of first openings BW-OP1. The composition (e.g., ink composition) IK may be provided to the first opening BW-OP1 utilizing an inkjet process. An inkjet head may include a nozzle that provides the composition IK. The inkjet head may provide (e.g., deposit) the composition IK to the first opening BW-OP1 while moving in a set or predetermined direction. When the composition IK is dried, the second optical pattern WC2 may be formed. The plurality of optical patterns WC may include a first optical pattern WC1 (see FIG. 2) that converts source light into first color light, and a second optical pattern WC2 (see FIG. 2) that converts source light into second color light, and a third optical pattern WC3 (see FIG. 2) that transmits source light.

In the process of providing the composition IK (or ink) through the inkjet process, the composition IK may be landed (e.g., deposited) onto the barrier rib BWb instead of the first opening BW-OP1. When the ink is landed onto the barrier rib BWb instead of the first opening BW-OP1, the ink may be spread due to the second portion P2 which is relatively less liquid repellent. For example, the ink landed onto the second portion P2 may form a partial sphere shape having a large radius of curvature, and a height formed by the ink on the barrier rib BWb may be reduced. Accordingly, in a subsequent bonding process, a gap defect in upper and lower plates or cracks of a thin film encapsulation layer may be less likely to happen or may be prevented or reduced.

In order to describe the difference in liquid repellent properties between the first portion P1 and the second portion P2, the ink IK1 landed onto the first portion P1 and the ink IK2 landed onto the second portion P2 are illustrated. The ink IK1 landed in a region which is more liquid repellent may have a partial sphere shape having a relatively small radius of curvature, and the ink IK2 landed in a region which is less liquid repellent may have a partial sphere shape having a relatively large radius of curvature.

The first portion P1 may be more liquid repellent than the second portion P2. The first portion P1 is adjacent to the first opening BW-OP1 and is relatively more liquid repellent, and thus, even when coating liquid supplied to the first opening BW-OP1 is landed onto an upper surface of the barrier rib BWb, it may not move to another portion (e.g., region). Accordingly, a defect in which the coating liquid flows out to another adjacent first opening BW-OP1 supplied with a different type or kind or kind of coating liquid may be reduced.

After the forming of the plurality of optical patterns WC, the upper encapsulation layer TFE2, the plurality of color filters CF1a, CF2a, and CF3a, and the protection layer OC may be sequentially stacked.

As described herein, a barrier rib includes a first portion, and a second portion which is less liquid repellent than the first portion. When ink is landed (e.g., deposited) onto the barrier rib instead of a first opening, the ink may be spread due to the second portion, which is relatively less liquid repellent. For example, the ink landed onto the second portion may form a partial sphere shape having a large radius of curvature, and a height formed by the ink on the barrier rib may be reduced. Accordingly, in a subsequent bonding process, a gap defect in upper and lower plates or cracks of a thin film encapsulation layer may be less likely to happen or may be prevented or reduced.

In some embodiments, a plurality of second openings non-overlapping (not overlapping) a light emitting region may be further defined in the barrier rib, and the second portion may be positioned adjacent to the plurality of second openings. Accordingly, the ink landed onto the barrier rib positioned adjacent to the second openings may be accommodated in the plurality of second openings BW-OP2. In this case, the mislanded ink does not remain on the barrier rib to prevent or reduce a height difference formed by the ink on the barrier rib.

In some embodiments, the first portion which is relatively more liquid repellent may be positioned adjacent to a plurality of first openings. Therefore, even when coating liquid supplied to the first opening is landed onto an upper surface of the barrier rib, it may not move to another portion (e.g., region). Accordingly, defects in which the coating liquid flows out to another adjacent first opening supplied with a different type or kind of coating liquid may be reduced.

The display device and/or any other relevant devices or components according to embodiments of the present disclosure described herein may be implemented utilizing any suitable hardware, firmware (e.g. an application-specific integrated circuit), software, or a combination of software, firmware, and hardware. For example, the one or more suitable components of the device may be formed on one integrated circuit (IC) chip or on separate IC chips. Further, the one or more suitable components of the device may be implemented on a flexible printed circuit film, a tape carrier package (TCP), a printed circuit board (PCB), or formed on one substrate. Further, the one or more suitable components of the device may be a process or thread, running on one or more processors, in one or more computing devices, executing computer program instructions and interacting with other system components for performing the one or more suitable functionalities described herein. The computer program instructions are stored in a memory which may be implemented in a computing device utilizing a standard memory device, such as, for example, a random access memory (RAM). The computer program instructions may also be stored in other non-transitory computer readable media such as, for example, a CD-ROM, flash drive, and/and/or the like. Also, a person of skill in the art should recognize that the functionality of one or more suitable computing devices may be combined or integrated into a single computing device, or the functionality of a particular computing device may be distributed across one or more other computing devices without departing from the scope of the embodiments of the present disclosure.

Although the present disclosure has been described with reference to a preferred embodiment of the present disclosure, it will be understood that the present disclosure should not be limited to these preferred embodiments but one or more suitable changes and modifications can be made by those skilled in the art without departing from the spirit and scope of the present disclosure. Hence, the technical scope of the present disclosure is not limited to the detailed descriptions in the specification but should be determined only with reference to the claims, and equivalents thereof.

What is claimed is:

1. A display device comprising:

a display layer in which a plurality of light emitting regions are defined;

a barrier rib on the display layer and having a plurality of first openings overlapping the plurality of light emitting regions defined therein and a plurality of second openings not overlapping the plurality of light emitting regions defined therein; and a plurality of optical patterns in the plurality of first openings, wherein the barrier rib comprises a first portion around the plurality of first openings and a second portion spaced apart from the plurality of first openings with the first portion therebetween, and the first portion is more liquid repellent than the second portion, wherein the plurality of second openings are surrounded by the second portion and spaced apart from the plurality of first openings, and wherein the first portion and the second portion are derived from a same material.

2. The display device of claim 1, further comprising a plurality of color filters overlapping the plurality of light emitting regions, wherein the plurality of color filters comprise a first color filter, a second color filter, and a third color filter, and each of the plurality of first openings corresponds to a corresponding one of the first color filter, the second color filter, or the third color filter.

3. The display device of claim 2, wherein each of the plurality of second openings overlaps all of the first color filter, the second color filter, and the third color filter.

4. The display device of claim 1, wherein when viewed on a plane, the second portion and the plurality of first openings are spaced apart by a first distance in a first direction or a second direction crossing the first direction.

5. The display device of claim 4, wherein the first distance is about 11 μm to about 20 μm.

6. The display device of claim 1, wherein the display layer comprises a first base substrate, a plurality of light emitting elements on the first base substrate, and an encapsulation layer covering the plurality of light emitting elements, and the first portion and the second portion of the barrier rib are defined on a lower surface of the barrier rib, which faces the encapsulation layer.

7. The display device of claim 6, further comprising:

a second base substrate spaced apart from the display layer with the barrier rib and the plurality of optical patterns therebetween; and a plurality of color filters on a lower surface of the second base substrate, wherein the barrier rib and the plurality of optical patterns are between the plurality of color filters and the display layer.

8. The display device of claim 7, wherein the lower surface of the second base substrate in contact with the plurality of color filters is flat.

9. The display device of claim 8, wherein the second portion of the barrier rib further comprises a spacer protruding towards the display layer.

10. The display device of claim 1, wherein the display layer comprises a base substrate, a plurality of light emitting elements on the base substrate, and an encapsulation layer covering the plurality of light emitting elements, and the first portion and the second portion of the barrier rib are defined on an upper surface of the barrier rib, which faces oppositely away from the encapsulation layer.

11. The display device of claim 10, further comprising:

a plurality of color filters on the barrier rib and the plurality of optical patterns; and a cover layer covering the plurality of color filters.

12. The display device of claim 11, wherein a lower surface of the cover layer in contact with the plurality of color filters is curved to correspond to shapes of the plurality of color filters.

13. A display device comprising:

a display layer in which a plurality of light emitting regions are defined;

a barrier rib on the display layer and having a plurality of first openings overlapping the plurality of light emitting regions defined therein and a plurality of second openings not overlapping the plurality of light emitting regions defined therein; and a plurality of optical patterns in the plurality of first openings, wherein the barrier rib comprises a first portion around the plurality of first openings and a second portion spaced apart from the plurality of first openings with the first portion therebetween, and the first portion has a lower surface energy than the second portion, wherein the plurality of second openings are surrounded by the second portion and spaced apart from the plurality of first openings, and wherein the first portion and the second portion are derived from a same material.

* * * * *